US011568907B2

(12) United States Patent
Mathew et al.

(10) Patent No.: US 11,568,907 B2
(45) Date of Patent: Jan. 31, 2023

(54) DATA BUS AND BUFFER MANAGEMENT IN MEMORY DEVICE FOR PERFORMING IN-MEMORY DATA OPERATIONS

(71) Applicant: Samsung Electronics Co., Ltd., Suwon-si (KR)

(72) Inventors: Eldho Pathiyakkara Thombra Mathew, Bangalore (IN); Anirudh Birur Kiran, Bangalore (IN); Hak-Soo Yu, Hwaseong-si (KR); Praful Ramesh Orakkan, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 17/124,056

(22) Filed: Dec. 16, 2020

(65) Prior Publication Data

US 2022/0076717 A1 Mar. 10, 2022

(30) Foreign Application Priority Data

Sep. 7, 2020 (IN) .............................. 202041038575

(51) Int. Cl.
*G11C 7/10* (2006.01)
*G06F 3/06* (2006.01)
(Continued)

(52) U.S. Cl.
CPC .......... *G11C 7/1057* (2013.01); *G06F 3/0656* (2013.01); *G11C 7/06* (2013.01);
(Continued)

(58) Field of Classification Search
CPC ....... G11C 7/1057; G11C 7/06; G11C 7/1012; G11C 7/1048; G11C 7/1084; G11C 7/20;
(Continued)

(56) References Cited

U.S. PATENT DOCUMENTS 7,899,990 B2    3/2011  Moll et al.
3,151,012 A1    4/2012  Kim et al.
(Continued)

OTHER PUBLICATIONS

Miao, Hardware Acceleration for Memory to Memory Copies,EECS Department, University of California, Berkeley, Jan. 13, 2017.
(Continued)

*Primary Examiner* — Charles Rones
*Assistant Examiner* — Hewy H Li

(57) ABSTRACT

A memory system includes a memory device including memory banks and a data bus management circuit and a host coupled to the memory device. The host includes a memory controller detecting at least one trigger initiated by at least one application for performing at least one operation on data stored within the memory device, the at least one operation including at least one of a data copy operation, and a data processing operation, and performing the at least one operation on the data within the memory device by enabling movement of the data between the data bus management circuit of the memory device and at least one memory bank of the memory banks, without exchanging the data with the host, using at least one buffer fill command and at least one buffer copy command.

20 Claims, 19 Drawing Sheets

(51) Int. Cl.
*G11C 7/20* (2006.01)
*G11C 7/06* (2006.01)

(52) U.S. Cl.
CPC .......... *G11C 7/1012* (2013.01); *G11C 7/1048* (2013.01); *G11C 7/1084* (2013.01); *G11C 7/20* (2013.01); *G06F 3/0602* (2013.01); *G06F 3/0604* (2013.01); *G06F 3/0629* (2013.01); *G06F 3/0658* (2013.01); *G06F 3/0659* (2013.01)

(58) Field of Classification Search
CPC ........... G11C 7/1006; G11C 2029/0411; G06F 3/0656; G06F 3/0602; G06F 3/0604; G06F 3/0629; G06F 3/0658; G06F 3/0659; G06F 15/7821; G06F 13/1673
See application file for complete search history.

(56) References Cited

U.S. PATENT DOCUMENTS

| | | | | |
|---|---|---|---|---|
| 2004/0236534 | A1* | 11/2004 | Wheless, Jr. ....... | G06F 11/3466 714/E11.2 |
| 2010/0312998 | A1* | 12/2010 | Walker ................ | G06F 15/7821 711/E12.001 |
| 2010/0312999 | A1* | 12/2010 | Walker ................ | G06F 15/785 711/E12.017 |
| 2015/0012717 | A1 | 1/2015 | Murphy | |
| 2016/0041856 | A1* | 2/2016 | Sankaralingam ... | G06F 15/7821 719/330 |
| 2018/0004692 | A1* | 1/2018 | Jokinen ................ | G06F 13/28 |
| 2021/0173557 | A1* | 6/2021 | Mai ....................... | G06F 3/0673 |
| 2021/0210125 | A1* | 7/2021 | Song ..................... | G06F 9/3893 |

OTHER PUBLICATIONS

Choi et al., "Multiple Clone Row Dram: A low latency and area optimized DRAM," 2015 ACM/IEEE 42nd Annual International Symposium on Computer Architecture (ISCA), 2015, pp. 223-234, Portland, OR.

Kanev et al., "Profiling a warehouse-scale computer," 2015 ACM/IEEE 42nd Annual International Symposium on Computer Architecture (ISCA), 2015, pp. 158-169, Portland, OR.

Seshadri et al., "RowClone: Fast and energy-efficient in-DRAM bulk data copy and initialization," 2013 46th Annual EEE/ACM International Symposium on Microarchitecture (MICRO), 2013, pp. 185-197, Davis, CA.

Su et al., "A Processor-DMA-Based Memory Copy Hardware Accelerator," 2011 IEEE Sixth International Conference an Networking, Architecture, and Storage, Dalian, Liaoning, 2011, pp. 225-229.

* cited by examiner

FIG. 5

| Function | CKE | CS_n | ACT_n | RAS_n | CAS_n | WE_n | A11 | CKE | CS_n | ACT_n | RAS_n | CAS_n | WE_n | A11 |
|---|---|---|---|---|---|---|---|---|---|---|---|---|---|---|
| | Commands from Memory Controller ||||||| Commands from Memory Array (After translation) |||||||
| Read | H | L | H | H | L | H | V | Same as received from controller |||||||
| Write | H | L | H | H | L | L | V | Same as received from controller |||||||
| Buffer Fill | H | L | H | L | H | H | H | H | L | H | H | L | H | V |
| Buffer Copy | H | L | H | L | H | H | L | H | L | H | H | L | L | V |

DATA BUS AND BUFFER MANAGEMENT IN MEMORY DEVICE FOR PERFORMING IN-MEMORY DATA OPERATIONS

CROSS-REFERENCE TO RELATED APPLICATION

This application claims the benefit of Indian Patent Application No. 202041038575, filed on Sep. 7, 2020 in the Indian Patent Office, the disclosure of which is incorporated by reference herein in its entirety.

TECHNICAL FIELD

The present disclosure relates to management of in-memory data operations and more particularly to performing data copy, data initialization, and data processing operations within a memory device without involving movement of data over a memory channel.

BACKGROUND

In a system, where multiple applications run simultaneously, data operations such as data copy and data initialization operations may be triggered for transferring data from one location to another location within a memory device and initializing the data to a specific value. In conventional approaches, the data operations within the memory device may be performed by transferring the data over a memory channel, even though such operations do not require any computations. As a result, the data operations performed within the memory device may need high latency, bandwidth, and energy/power, which may further degrade the performance of the system.

FIGS. 1a and 1b depict an example conventional memory system for performing data copy operations. As depicted in FIGS. 1a and 1b, the conventional memory system includes a memory device, and a host. The memory device communicates with the host over a memory channel. The host includes a Central Processing Unit (CPU), a memory copy accelerator/cache control block, and a memory controller. The memory device includes a plurality of memory banks/arrays, a plurality of sense amplifiers associated with the plurality of memory banks, a pre-fetch buffer and on-die error-correcting code (ECC) block, a command decoder, an address circuitry coupled to a row address circuitry and a column address circuitry, and an Input/output (10) circuitry.

The memory copy accelerator/cache control block of the host may initiate a trigger for the data copy operations in response to a request from the at least one application (which is being executed on the host) for transferring the data from one location to the other location in the memory device. The data copy operations may involve reading/accessing the required data from one location and writing the accessed data to the other location within the memory device.

The memory copy accelerator/cache control block communicates with the memory controller about the initiated trigger for the data copy operations. Based on the initiated trigger for the data copy operations, the memory controller identifies a source location to access/read the data and a destination location to which the accessed/read data have to be written. The source location and the destination location includes information such as, but not limited to, the bank ID (i.e., a bank address) of the memory bank from which the required data is to be read and to be written, row address within the bank and a column address within the row in the identified bank ID. The memory controller then issues a READ command to the IO circuitry of the memory device over the memory channel with the identified column address, when the corresponding row has already been activated in the memory bank identified for accessing the data, hence data may be available at sense amplifier of the memory bank. The IO circuitry transfers the READ command to the command decoder and the column address to the column address circuitry. The command decoder provides the READ command to the bank/column selection logic associated with the identified memory bank. The column address circuitry feeds the received column address to the bank/column selection logic associated with the identified memory bank. The bank/column selection logic reads data from the corresponding sense amplifier and the memory bank that corresponds to the column corresponding to the received column address within the activated row (the source location). The bank/column selection logic then transfers the accessed data to the pre-fetch buffer and on-die ECC checker. The IO circuitry transfers the accessed data from the pre-fetch buffer and on-die ECC checker to the memory controller over the memory channel.

The memory controller forwards the received data to the memory copy accelerator/cache control block. The memory copy accelerator/cache control block copies the required data into a cache and provides the copied data to the memory controller to write the received data to the destination location in the memory bank. On receiving the data for writing into the memory bank, the memory generates a WRITE command by activating the corresponding row in the memory bank, to which the data have to be written. The memory controller issues the WRITE command along with the data and the column address of the memory bank, to which the data have to be written to the IO circuitry of the memory device over the memory channel. The IO circuitry forwards the received column address to the column address circuitry, the WRITE command to the command decoder and the data to the bank/column selection logic of the associated memory bank into which the data have to be written. The command decoder decodes the WRITE command and issues the decoded WRITE command to the bank/column selection logic of the associated memory bank into which the data have to be written. The column address circuitry feeds the received column address to the bank/column selection logic of the associated memory bank into which the data have to be written. The bank/column selection logic connects the corresponding sense amplifier associated with the memory bank to the pre-fetch buffer to write the received data to the received column address within the activated row (the destination location). Thus, in the conventional system, the data copy operations involve data movement over the memory channel. The data movement over the memory channel may be performed as one byte/word/cache line at a time, which may result in high latency. Also, the data movement over the memory channel may involve large data transfers, which may further affect the performance of the concurrently running applications that share the memory bandwidth. In addition, the data movement over the memory channel may consume more energy/power.

OBJECTS

The principal object of the embodiments herein is to disclose methods and systems for performing data operations within a memory device without involving movement of data over a memory channel, wherein the data operations include data copy operations, data processing operations, and data initialization operations.

Another object of the embodiments herein is to disclose methods and systems for implementing a buffer in the memory device and facilitating the data movements in the buffer for performing the data copy operations within the memory device.

Another object of the embodiments herein is to disclose methods and systems for enabling a processing in memory (PIM) cluster within the memory device to access the data from the buffer and process the accessed data.

Another object of the embodiments herein is to disclose methods and systems for initializing the data, within the memory device, with at least one of physical continuous location addresses, scattered location addresses and known data patterns.

Another object of the embodiments herein is to disclose methods and systems for initiating buffer fill commands (BUFF_FILL commands) and buffer copy commands (BUFF_COPY command) to perform the data operations within the memory device.

SUMMARY

According to an exemplary embodiment of the present invention, a memory system includes a memory device including a plurality of memory banks and a data bus management circuit and a host coupled to the memory device. The host includes a memory controller configured to detect at least one trigger initiated by at least one application for performing at least one operation on data stored within the memory device, the at least one operation including at least one of a data copy operation, and a data processing operation, and perform the at least one operation on the data within the memory device by enabling movement of the data between the data bus management circuit of the memory device and at least one memory bank of the plurality of memory banks, without exchanging the data with the host, using at least one buffer fill command and at least one buffer copy command.

According to an exemplary embodiment of the present invention, a method for performing data operations within a memory device coupled to a host includes detecting, by a memory controller of the host, at least one trigger initiated by at least one application for performing at least one operation on data stored within the memory device, the at least one operation including at least one of a data copy operation, and a data processing operation, and performing, by the memory controller, the at least one operation on the data stored within the memory device by enabling movement of the data between a data bus management circuit of the memory device and at least one memory bank of a plurality of memory banks of the memory device, without exchanging the data with the host, using at least one buffer fill command and at least one buffer copy command.

According to an exemplary embodiment of the present invention, a host coupled to a memory device in a memory system includes a central processing unit (CPU), a memory copy accelerator circuit coupled to the CPU and configured to detect a trigger for a data copy operation within the memory device from at least one application running on the CPU, the data copy operation including copying of data required by the at least one application from at least one source location to at least one destination location within the memory device, and a memory controller configured to perform the data copy operation by enabling movement of the data between a data bus management circuit of the memory device and at least one memory bank of a plurality of memory banks of the memory device, without receiving the data from the at least one memory bank, using at least one buffer fill command and at least one buffer copy command.

According to an exemplary embodiment of the present invention, a memory device coupled to a host in a memory system, includes a plurality of memory banks, and a data bus management circuit configured to receive, in response to at least one buffer fill command from the host, data required by at least one application which is running on the host from at least one source location of a first memory bank of the plurality of memory banks and store the received data in a buffer of the data bus management circuit, and write, in response to at least one buffer copy command from the host, the stored data in the buffer to at least one destination location of a second memory bank of the plurality of memory banks.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

BRIEF DESCRIPTION OF FIGURES

Embodiments herein are illustrated in the accompanying drawings, throughout which like reference letters indicate corresponding parts in the various figures. The embodiments herein will be better understood from the following description with reference to the drawings, in which:

FIG. 5 is a diagram depicting an example command pattern of a buffer fill command (BUFF_FILL command), a buffer copy command (BUFF_COPY command), a READ command, and a WRITE command, according to embodiments as disclosed herein;

cluster with computation data and processing of the data on the PIM cluster using the initialized computation data, according to embodiments as disclosed herein.

DETAILED DESCRIPTION

Figure 1A:
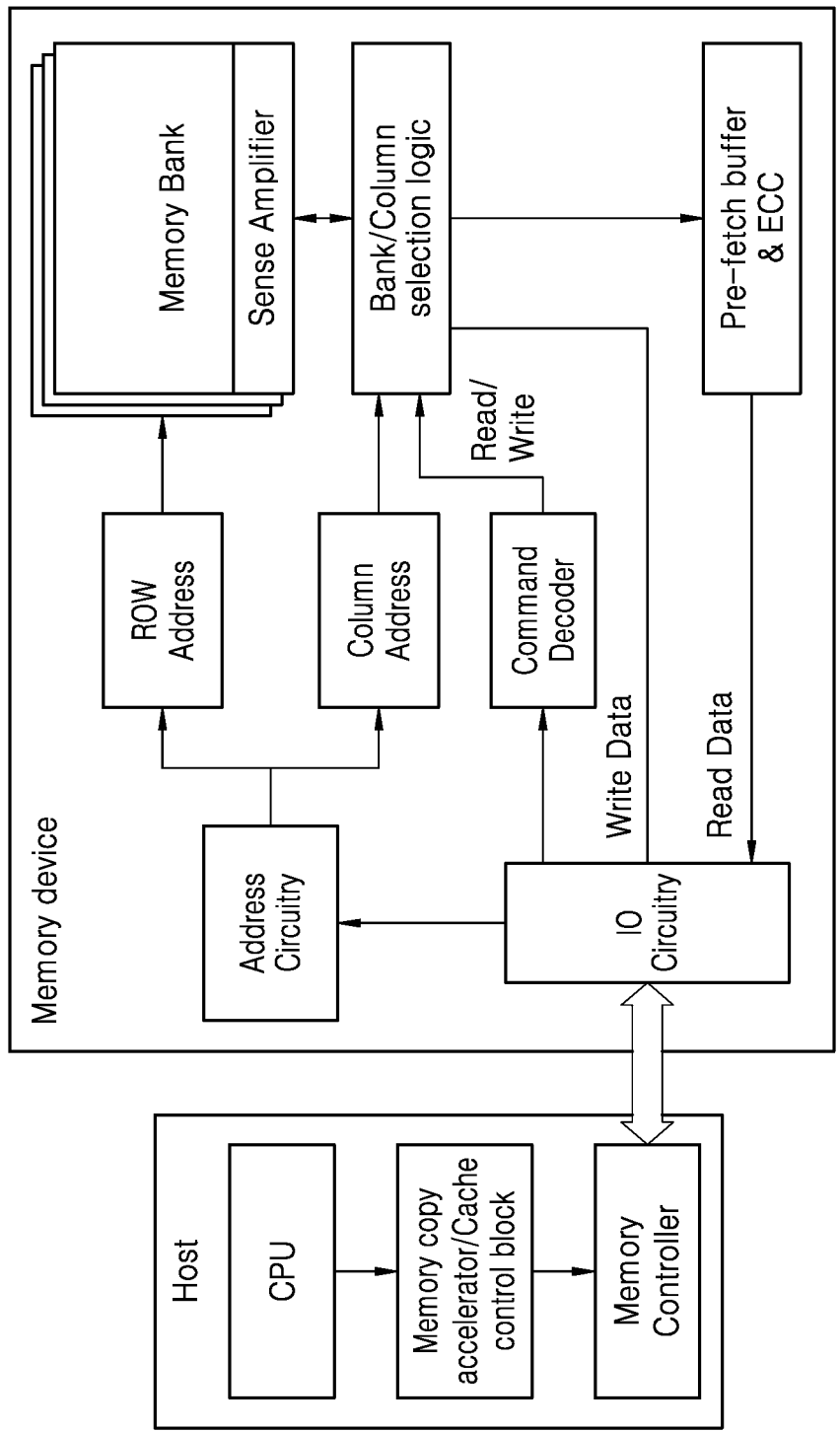
FIGS. 1a and 1b depict an example conventional memory system for performing data copy operations.
Figure 1B:
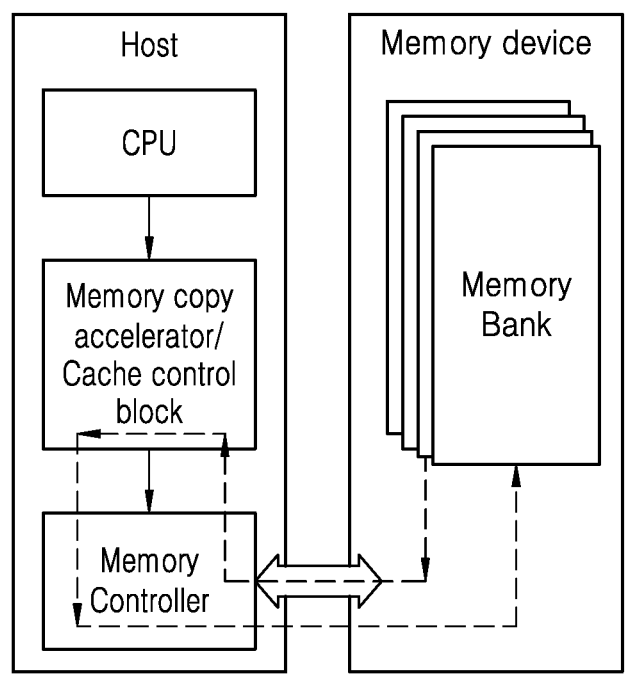

The example embodiments herein and the various features and advantageous details thereof are explained more fully with reference to the non-limiting embodiments that are illustrated in the accompanying drawings and detailed in the following description. Descriptions of well-known components and processing techniques are omitted so as not to unnecessarily obscure the embodiments herein. The description herein is intended merely to facilitate an understanding of ways in which the example embodiments herein may be practiced and to further enable those of skill in the art to practice the example embodiments herein. Accordingly, this disclosure should not be construed as limiting the scope of the example embodiments herein.

Embodiments herein disclose methods and systems for performing data operations within a memory device without involving movement of data over a memory channel, wherein the data operations include at least one of data copy operations, data processing operations, and data initialization operations.

Embodiments herein disclose methods and systems for performing the data copy operations within the memory device by implementing a buffer in the memory device.

Embodiments herein disclose methods and systems for performing the data processing operations within the memory device by implementing a processing in memory (PIM) cluster in the memory device.

Embodiments herein disclose methods and systems for performing the data copy operations between memory bank and the PIM cluster without involving the data movements over the memory channel.

Embodiments herein use buffer fill commands, and buffer copy commands for performing the data operations within the memory device.

Referring now to the drawings, and more particularly to FIGS. 2a through 10, where similar reference characters denote corresponding features consistently throughout the figures, there are shown example embodiments.

Figure 2A:
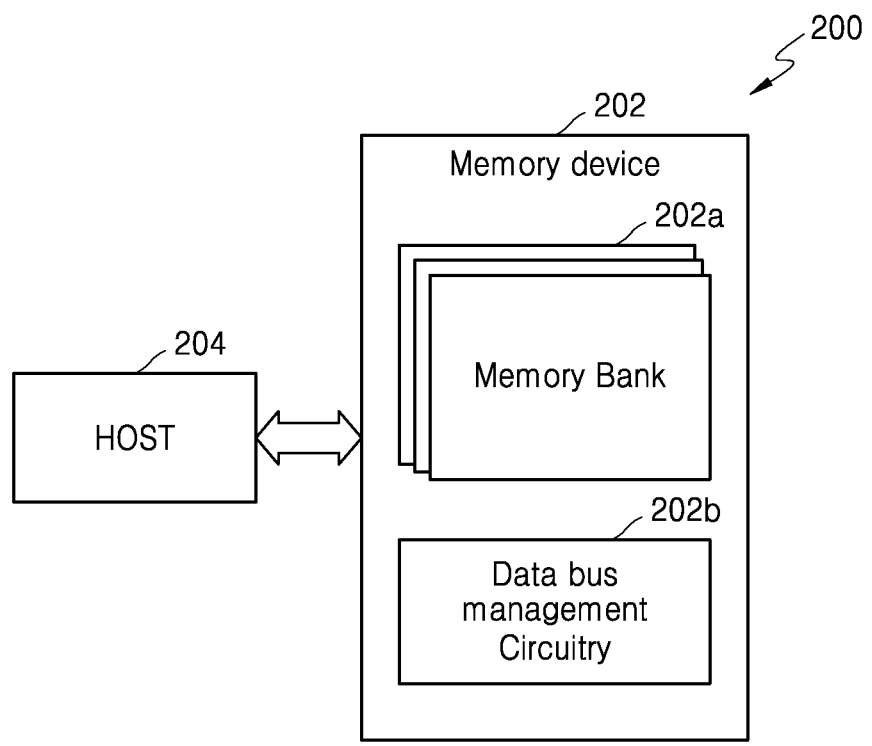
FIGS. 2a and 2b depict a memory system, according to embodiments as disclosed herein.
Figure 2B:
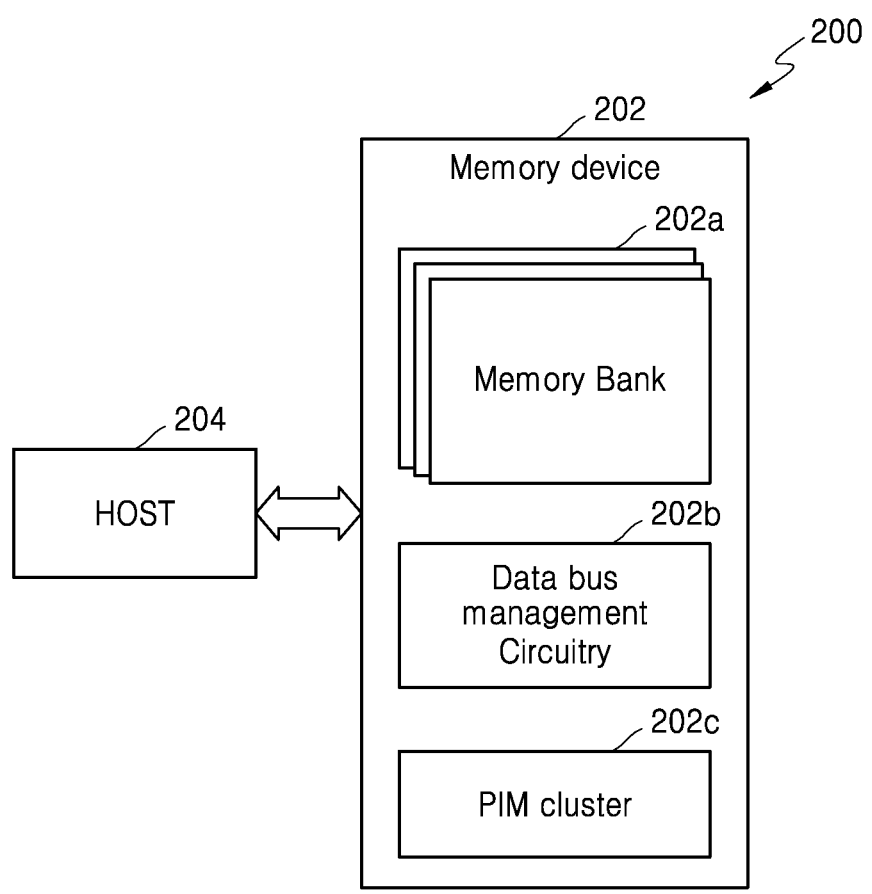

FIGS. 2a and 2b depict a memory system 200, according to embodiments as disclosed herein. The memory system 200 includes at least one memory device 202 and a host 204.

The memory device 202 referred herein may be a device with memory components for storing data. The data may be related to a plurality of applications (i.e., application programs) deployed on the host 204. The application programs may be a comprehensive, self-contained program that performs a specific function for the user. Among many others, application programs may include, but not limited to, a call related application, an Over-the Top-(OTT) application, a streaming application, a file downloading related application, a social networking application, a camera application, an IoT related application, an enterprise application, a data management application, an Augmented Reality (AR) related application, a gaming related application, and so on. The memory device 202 referred herein may also be a processing in memory (PIM) device (the integration of a processor logic with memory) for storing the data as well as processing the data received from the host 204 as depicted in FIG. 2b.

In an embodiment, the memory device 202 may include at least one of a random access memory, a flash memory, a solid-state disk (SSD), a magnetic disk, a cache or any other device that may store the required data. Examples of the random access memory may be, but not limited to, a static random-access memory (SRAM), a dynamic random-access memory (DRAM), a synchronous a graphics random-access memory (SGRAM), a High Bandwidth Memory (HBM), a magneto resistive random-access memory (MRAM) and so on. Examples of the flash memory may be, but is not limited to, a NOR flash, a NAND flash, and so on. In an embodiment, the memory device 202 may be at least one type of the DRAM such as, but not limited to, a synchronous DRAM (SDRAM), a double data rate synchronous DRAM (DDR SDRAM), a graphics double data rate DRAM (GDDR DRAM), a quad data rate DRAM (QDR DRAM), a video DRAM (VDRAM), an extended data out DRAM (EDO DRAM), a multibank DRAM (MDRAM), and so on. In an embodiment, the memory device 202 may be at least one of a monolithic memory circuit, a semiconductor die, a stack of memory dies, a chip, a packaged memory circuit, or any other type of tangible memory circuit.

The memory device 202 may communicate with the host 204 over a memory channel/bus. The memory channel may support various protocols such as, but not limited to, memory protocols (for example, dual in-line memory module (DIMM) interface, LPDDR, LPDRAM, JEDEC, and so on), Input/Output (I/O) protocols (for example, PCI, InfiniBand, and so on), networking protocols (for example: Ethernet, Transport Control Protocol/Internet Protocol (TCP/IP), and so on), storage protocols (for example: Network File System (NFS), Serial Advanced Technology Attachment (SATA), Serial Attached SCSI (SAS), and so on), wireless protocols, and so on for enabling the memory device 202 to communicate with the host 204.

In an embodiment, the memory device 202 includes a plurality of memory banks 202a and data bus management circuitry (i.e., a data bus management circuit) 202b as depicted in FIG. 2a. The memory banks 202a may store the data of the plurality of applications deployed on the host 204. The data bus management circuitry 202b may be configured to manage the data that is accessed from the memory bank or to be written to the memory bank during reading/writing operations of the memory bank 202a. In an embodiment, the data bus management circuitry 202b facilitates storing of the accessed data from the memory bank 202a within the memory device 202 without allowing the accessed data to flow over the memory channel, so that the data stored within the memory device 202 may be used for writing into the memory bank 202a without accessing the data over the memory channel while the host 204 wants to perform in-memory copy.

In an embodiment, the memory device 202 also includes a PIM cluster (i.e., PIM circuit) 202c as depicted in FIG. 2b, wherein the PIM cluster 202c may be coupled with the data bus management circuitry 202b. The PIM cluster 202c may be configured for receiving the data (accessed from the memory bank 202a) from the data bus management circuitry 202b and processing the received data. In an example herein, the processing of the received data may involve performing a computational operation such as, but not limited to, arithmetic computations, logical computations, encoding, decoding, filtering, digital signal processing (DSP) operations (such as transpose, matrix operations, fast Fourier transform (FFT), or the like), and so on. The PIM cluster 202c further provides the processed data to the data bus management circuitry 202b, which further writes the received processed data to the memory bank 202a.

The host 204 referred herein may be at least one of a processor, a System on Chip (SoC), a server, an integrated chip (IC), a chipset, a mobile computing device, a mobile phone, a smartphone, a tablet, a phablet, a personal digital assistant (PDA), a laptop, a computer, a wearable device, an IoT (Internet of Things) device, a wearable computing device, a vehicle infotainment system, a medical device, a camera, an application processor (AP), a multiprocessor system, a microprocessor based programmable consumer electronics, a network computer, a minicomputer, a mainframe computer, and/or any other device which supports the memory device 202.

The host 204 may be configured to manage operations of the memory device 202 by maintaining information about the memory device 202. The operations may be at least one of reading operations, writing operations, or the like. The information may be at least one of information about the memory banks 202a, the data stored in the memory banks 202a, locations/addresses of the stored data, or the like.

In an embodiment, the host 204 may also be configured to manage data operations within the memory device 202 on receiving a request from the at least one application being executing on the host 204. The data operations include at least one of the data copy operations, the data processing operations, and the data initialization operations. The data copy operations involve reading/accessing data from at least one location (hereinafter referred as a source location) and writing the accessed data to at least one other location (hereinafter referred as a destination location) within the memory device 202. The data referred herein may be data stored in the at least one memory bank 202a of the memory device 202 and required by the at least one application or another application. The source location and the destination location may be different in case of the data copy operations. The source and destination locations may be at least one of different locations within the same memory bank 202a, different locations within the different memory banks 202a, and so on. The data processing operations involve reading/accessing the data from the source location, processing the accessed data, and writing the accessed data to the destination location within the memory device 202. The source and destination locations may be same or different locations in case of the data processing operations. The data initialization operations involve initializing the accessed data to a specific value, wherein the specific value may be at least one of addresses of the source and destination locations, addresses associated with data patterns to be read or written, or the like.

As depicted in FIG. 2a, for performing the data copy operations, the host 204 receives a request from the at least one application for the data copy operations. On receiving the request, the host 204 identifies the data required to be copied, the source location and the destination location. The source location may include information about the at least one location in the at least one memory bank 202a from which the data have to be accessed. The destination location may include information about the at least one location in the same memory bank 202a or different memory banks 202a to which the data have to be written in the same memory device 202. The at least one memory bank 202a specified in the source location and the destination location may be different banks or the same bank. Thereafter, the host 204 initiates a buffer fill (BUFF_FILL) command for reading the required data from the identified location of the at least one memory bank 202a (the source location) of the memory device 202. In an embodiment, the BUFF_FILL command may be a command in which a normal READ command (that is defined in the standard specification) is encoded with additional information necessary to perform the BUFF_FILL command. The format of the BUFF_FILL command will be described in detail with reference to FIG. 5. For example, the BUFF_FILL command may initiate a read operation on the memory device 202 and read data may be stored in a buffer of the memory device 202 without being provided to the host 204 from the memory device 202. The host 204 issues the BUFF_FILL command along with the identified location of the at least one memory bank 202a (the source location) to the memory device 202. On receiving (i.e., In response to) the BUFF_FILL command, the memory device 202 initiates the read operation to access the identified location (the source location) in the corresponding memory bank 202a. In an embodiment, the BUFF_FILL command may be issued in plural when the source location is in plural. On accessing the data from the identified location, the data bus management circuitry 202b stores the accessed data from the identified location of the at least one memory bank 202a without providing the data to the host 204 over the memory channel.

The host 204 may identify the completion of read operation (accessing of the data from the source location of the memory bank 202a) by tracking (or counting) the time defined for the read operation. After accessing the data from the identified location of the memory bank 202a, the host 204 initiates buffer copy (BUFF_COPY) command(s) to write the accessed data to the identified location of the at least one memory bank 202a (the destination location). In an embodiment, the BUFF_COPY command may be a command in which a normal WRITE command (that is defined in the standard specification) is encoded with additional information necessary to perform the normal WRITE command. The format of the BUFF_COPY command will be described in detail with reference to FIG. 5. For example, the BUFF_COPY command may initiate a write operation on the memory device 202 and data to be written to the memory device 202 may be provided from the buffer of the memory device 202 without being provided from the host 204. In an embodiment, the host 204 initiates the BUFF_COPY command without receiving the accessed data from the memory device 202. The host 204 issues the initiated BUFF_COPY command to the memory device 202 along with the destination location. In an embodiment, the BUFF_COPY command may be issued in plural when the destination location is in plural. At the memory device 202, on receiving the BUFF_COPY command, the data bus management circuitry 202b writes the stored accessed data to the identified location of the at least one memory bank 202a (the destination location). Thus, the data copy operations may be performed without involving the data movements over the memory channel between the memory device 202 and the host 204, which further increases the performance and the energy efficiency of the memory system 200 and enables to copy even a byte of data from the one location to the another location by utilizing data mask driven from the host 204.

As depicted in FIG. 2b, for performing the data processing operations, the host 204 receives a request from the at least one application for the data processing operations. On receiving such request, the host 204 identifies the data required to be copied/processed, processing requirement, information about the source location and information about the destination location within the memory device 202. The source location may include information about the at least one location in the at least one memory bank 202a from which the data have to be accessed. The destination location may include information about the at least one location in the at least one memory bank 202a to which the data have to be written. The locations and the at least one memory bank 202a specified in the information about the source location may be the same as or different from those specified in the information about the destination location. Thereafter, the host 204 initializes the PIM cluster 202c with computation data required for processing the data, when the memory system 200 or the memory device 202 is booted. Alternatively, the host 204 may initialize the PIM cluster 202c with the computation data, when the PIM cluster 202c receives the data from the data bus management circuitry 202b for the processing. The initialization of the PIM cluster 202c for processing the data using the computation data will be described in detail with reference to FIGS. 10a and 10b. Further, the host 204 initiates the BUFF_FILL command for reading the required data from the identified location of the at least one memory bank 202a (the source location) of the memory device 202 and processing the accessed data. The host 204 issues the BUFF_COPY command along with the identified location of the at least one memory bank 202a (the source location) to the memory device 202. On receiving the BUFF_FILL command, the memory device 202 may initiate the read operation to access the identified location in the corresponding memory bank 202a. On accessing the data from the identified location, the data bus management circuitry 202b stores the accessed data from the identified location of the at least one memory bank 202a without providing the data to the host 204 over the memory channel. Further, the PIM cluster 202c communicates with the data bus management circuitry 202b and receives the accessed data. The PIM cluster 202c processes the received accessed data using the computation data received from the host 204.

Once the processing is completed on the PIM cluster 202c in the memory device 202, the host 204 initiates the BUFF_COPY command to write the accessed data to the identified location of the at least one memory bank 202a (the destination location). In an embodiment, the host 204 initiates the BUFF_COPY command without receiving the processed data from the memory device 202. The host 204 issues the initiated buffer copy commands to the memory device 202 with the destination location at the end of processing of the data. At the memory device 202, on receiving the buffer copy commands, the PIM cluster 202c provides the processed data to the data bus management circuitry 202b, which further writes the processed data to the identified location of the at least one memory bank 202a (the destination location) after PIM operations. Thus, the data processing operations may be performed without involving the data movements over the memory channel, which further increases performance and energy efficiency of the memory system 200.

In an embodiment, the host 204 may also issue the BUFF_FILL and BUFF_COPY commands for performing the read and write operations on the memory device 202, while performing the normal read and write operations (i.e. involving data movement over the memory channel) corresponding to normal READ and WRITE commands. Thus, the BUFF_FILL and BUFF_COPY commands and the normal READ and WRITE commands may co-exist and the read and write operations corresponding to the BUFF_FILL and BUFF_COPY commands can be performed without affecting the normal read and write operations.

Figure 3A:
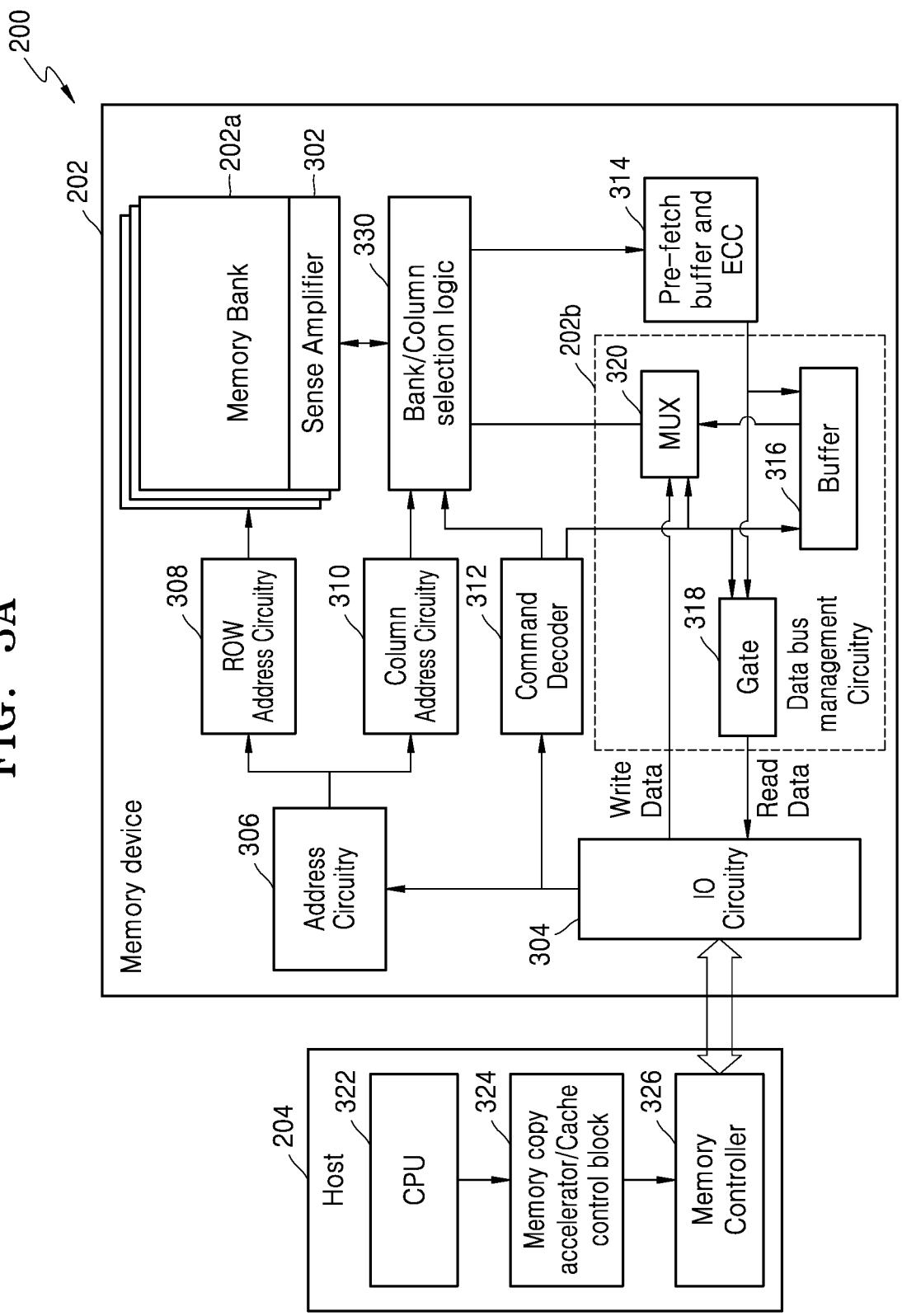
FIGS. 3a-3d are block diagrams depicting various components of the memory system for performing data operations within a memory device, according to embodiments as disclosed herein.
Figure 3B:
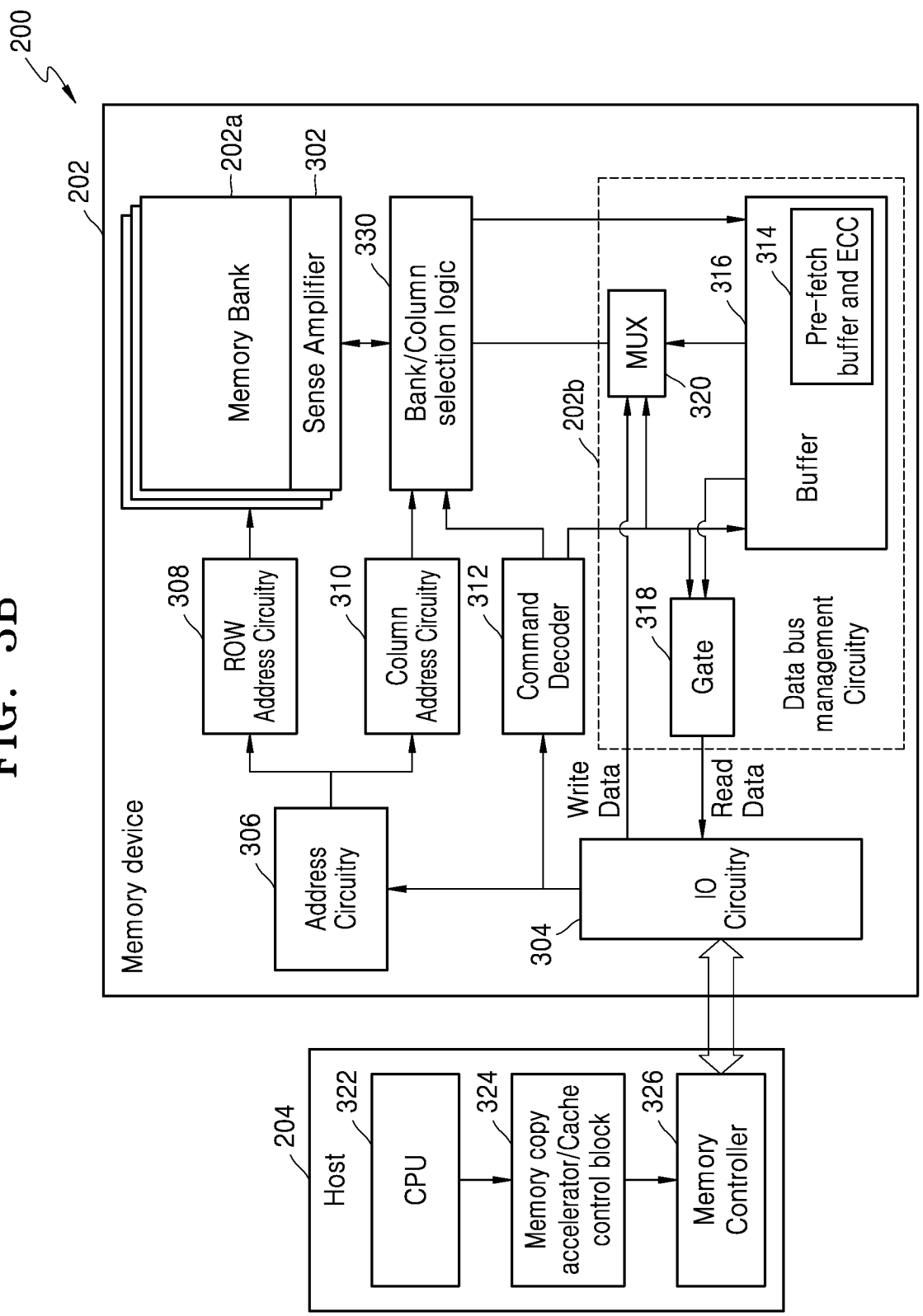

FIGS. 3a and 3b are block diagrams depicting various components of the memory system 200 for performing the data copy operations within the memory device 202, according to embodiments as disclosed herein. As depicted in FIG. 3a, the memory device 202 includes a plurality of memory banks 202a, a plurality of sense amplifiers 302, a bank/column selection logic 330, an input/output (IO) circuitry 304, an address circuitry (i.e., address buffer) 306, a row address circuitry (i.e., a row address decoder) 308, a column address circuitry (i.e., a column address decoder) 310, a command decoder 312, a pre-fetch buffer and ECC 314, and the data bus management circuitry 202b. The data bus management circuitry 202b includes a buffer 316, a gate 318, and a multiplexer (MUX) 320 for managing the data that is accessed/to be written from/to the at least one memory bank 202a during the data copy operations. In an embodiment, the buffer 316 of the data bus management circuitry 202b may be integrated with the pre-fetch buffer and ECC 314 as depicted in FIG. 3b.

The plurality of memory banks 202a may be configured to store the data related to the plurality of applications deployed on the host 204. Each memory bank 202a, identified with a bank identifier (bank ID), may include a plurality of memory subarrays. Each memory subarray may be arranged in addressable rows and columns. Each subarray may include a two-dimensional array of memory cells that are connected to the at least one sense amplifier 302. The memory cell may include a capacitor to store the data in a form of bits and an access transistor that determines if the cell is currently being accessed for the data. The memory cell may be connected to the at least one sense amplifier 302 using a wire, which may be herein referred to as a bit line. The access transistor of the memory cell may be controlled by a wire, which may be herein referred to as a word line.

The IO circuitry 304 may be configured to receive commands from the host 204. In an example herein, the commands may be at least one of the BUFF_FILL commands, and the BUFF_COPY commands for performing the data copy operations within the memory device 202 by enabling the movement of the data between the data bus management circuitry 202b and the memory bank 202a without exchanging the data with the host 204. The BUFF_FILL commands may be used for accessing/reading the data from the source locations and the BUFF_COPY commands may be for writing the accessed data to the destination locations within the memory device 202. The IO circuitry 304 may also receive the normal READ or WRITE commands from the host 204 for performing the normal read or write operations. The IO circuitry 304 may also be configured to receive the address inputs with the commands from the host 204. The address inputs may indicate information about the source locations and the destination locations. The source locations may include information about the at least one location (for example, in the memory subarray) in the at least one memory bank 202a from which the data have to be accessed. The destination locations may include information about the at least one location (for example, in the memory subarray) in the at least one memory bank 202a to which the data have to be written. The locations specified in the source location and the destination location may be different from each other, and the at least one memory bank 202a specified in the source location may be different from or the same as that of the destination location. The location included in the source location and the destination location may be identified with at least one of bank identifiers (IDs) of the at least one memory bank 202a, a row address, a column address within the row selected with the row address, and so on. The IO circuitry 304 further provides the address inputs to the address circuitry 306 and the received commands to the command decoder 312.

The address circuitry 306 may be configured to selectively route the received address inputs to at least one of the row address circuitry 308 and the column address circuitry 310 for reading/writing the data from/to the memory bank 202a. The address circuitry 306 provides the received row addresses to the row address circuitry 308, which further provides the row addresses to the memory bank 202a associated with the received bank IDs, so that the corresponding rows/word lines are activated to access/write the data and the sense amplifier 302 connected to the activated rows may be enabled. The address circuitry 306 provides the received column addresses to the column address circuitry 310. The column address circuitry 310 may provide the received column addresses to the bank/column selection logic 330 that read/write the data from/to the sense amplifier 302 associated with the memory bank of the corresponding received column addresses (the source locations/destination locations).

The command decoder 312 may be configured to decode the BUFF_FILL/BUFF_COPY commands received from the IO circuitry 304 and provide the decoded BUFF_FILL/BUFF_COPY commands to the buffer 316 of the data bus management circuitry 202b. The command decoder 312 provides the decoded BUFF_FILL commands to the buffer 316 for storing the data accessed from the at least one location of the at least one memory bank 202a. The command decoder 312 provides the decoded BUFF_COPY commands to the buffer 316 for providing the stored accessed data to the sense amplifier 302 through the MUX 320 for writing the data to the at least one location of the at least one memory bank 202a. The command decoder 312 may also be configured to translate the BUFF_FILL commands/BUFF_COPY commands to READ commands/WRITE commands from the operation codes (op-codes) of the BUFF_FILL and the BUFF_COPY commands, and provide the translated commands to the sense amplifier 302 through the bank/column selection logic 330 or relevant internal circuitry for reading/writing the data from/to the memory bank 202a. In an embodiment, the operation codes may be stored in a field of an instruction, received from the host 240, which identifies the type of operation which is to be performed.

The sense amplifier 302 and the associated memory bank 202a, under control of the bank/column selection logic 330 or the relevant internal circuitry of the memory device 202, may read/access the data from the source locations or write the accessed/read data to the destination locations. It should be noted that the commands may be provided to at least one of the bank/column selection logic 330, the sense amplifier 302, or any other relevant internal circuitry of the memory device 202 for performing the reading or writing operations and it may vary based on at least one of a type of the memory device 202, a specification of the memory device 202, and so on.

The pre-fetch buffer and error correcting code (ECC) module 314 may store the data accessed by the sense amplifier 302 and the at least one memory bank 202a from the source locations and correct bits if there are any error detected.

The buffer 316, in response to the BUFF_FILL commands from the IO circuitry 304, may receive data from the pre-fetch buffer and ECC 314 and store the data accessed from the source locations of the at least one memory bank 202a associated with the received BUFF_FILL commands.

In an embodiment, the buffer 316 may be the pre-fetch buffer and ECC module 314 that directly receives and stores the accessed data from the source locations corresponding to the received BUFF_FILL commands as depicted in FIG. 3b. In an embodiment, the buffer 316 may be integrated with the pre-fetch buffer and ECC module 314 for receiving and storing the accessed data from the sense amplifier 302 as depicted in FIG. 3b. The buffer 316 further provides, in response to the BUFF_COPY commands, the stored data to the bank/column selection logic 330 through the MUX 320 to write the data to the destination locations of the at least one memory bank 202a associated with the BUFF_COPY commands.

The gate 318 may be operated/enabled during the writing operations of the memory bank 202a (i.e. on receiving the BUFF_COPY commands). The gate 318 may be disabled when command decoder 312 detects the BUFF_COPY commands, hence the stored accessed data in the buffer 316 does not flow to the IO circuitry 304. In an embodiment, the command decoder 312, upon the detection of the BUFF_COPY commands, may generate a disabling signal to the gate 318. During the operation of the normal READ commands from the host 204, the gate 318 may be enabled so that data may be delivered to the host 204. In an embodiment, the command decoder 312, upon the detection of the normal READ commands not encoded in the BUFF_FILL command, may generate an enabling signal to the gate 318. For the simplicity of drawings, the signal path between the command decoder 312 and the gate 318 is not indicated with reference characters.

The MUX 320 may be operated/enabled during the writing operations of the memory bank 202a (i.e. on receiving the BUFF_COPY commands). The MUX 320 may select the data from the buffer 316 when the BUFF_COPY commands are detected by the command decoder 312 and provide the selected data to the sense amplifier 302 through the bank/column selection logic 330. In an embodiment, the command decoder 312, upon the detection of the BUFF_COPY commands, may generate a disabling signal to the MUX 320. The sense amplifier 302 and the associated memory bank 202a write the received read/accessed data to the destination locations. In an embodiment, the sense amplifier 302 may also serve as a write driver. The present invention is not limited thereto. In an embodiment, a separate write driver may be provided to deliver the data received from the host 204 to the at least one memory bank 202a. During the operation of the normal WRITE commands, the MUX 320 may be enabled so that data may be directly delivered from the host 204 to the at least one memory bank 202a through the bank/column selection logic 330. In an embodiment, the command decoder 312, upon the detection of the normal WRITE commands not encoded in the BUFF_COPY command, may generate an enabling signal to the MUX 320. For the simplicity of drawings, the signal path between the command decoder 312 and the MUX 320 is not indicated with reference characters.

As depicted in FIGS. 3a and 3b, the host 204 includes a Central Processing Unit (CPU) 322, a memory copy accelerator/cache control block 324, and a memory controller 326. The CPU 322 may include at least one of a single processer, a plurality of processors, multiple homogenous cores, multiple heterogeneous cores, multiple Central Processing Units (CPUs) of different kinds and so on. The CPU 322 may be configured to execute the plurality of applications to perform at least one task. Examples of the task may be, but not limited to, face detection, photo processing, media (audio, video, image, or the like) processing, face tagging, object identification in the media, graphics related processing, gaming related processing, machine learning tasks, Artificial intelligence (AI) tasks, and so on.

The memory copy accelerator/cache controller block 324 may be configured to maintain and manage the information about the plurality of applications that are being executed on the CPU 322 and the memory device 202. In an embodiment, the memory copy accelerator/cache controller block 324 may detect the request initiated by the at least one application (executed on the CPU 322) for the data operations. In an embodiment, the memory copy accelerator/cache controller block 324 checks the source and destination addresses of the data required by the application to determine if both the addresses lie in the same memory device. On determining that the source and destination addresses lie in the same memory device, the memory copy accelerator/cache controller block 324 triggers the in-memory data copy operation. In an embodiment, the memory copy accelerator/cache controller block 324 may be configured with the start and end addresses of each memory device 202 and may determine if the source and destination addresses of the data required by the application lie in the same memory device 202. On determining that the source and destination addresses lie in the same memory device, the memory copy accelerator/cache controller block 324 triggers the in-memory data copy operation. For the simplicity of drawings, a single memory device is shown on FIGS. 3a and 3b. However, the memory device 202 may be in plural. In an embodiment, the memory device 202 in plural may be, but not limited to, a memory module, a stack of memory dies or a stack of packaged memory devices. For example, the memory device 202 in plural may be included in a HBM (High Bandwidth Memory). The HBM may include a CPU, a logic die and a stack of memory dies. In an embodiment, the memory copy accelerator/cache controller block 324 may identify each of the memory device 202 in plural using the address thereof, and when determining that the source and destination addresses of the data required by the application lie in the same memory device 202, may trigger the in-memory data copy operation.

The memory controller 326 may be configured to maintain information about the memory device 202. In an example, the information may be, but not limited to, the number of memory banks 202a in the memory device 202, the data stored in the memory banks and the corresponding address, and so on. The memory controller 326 receives the trigger from memory copy accelerator/cache control block 324 to perform the data copy operations within the memory device 202 by performing the reading and writing operations of the memory banks 202a of the memory device 202 without exchanging the data with the host 204. In an embodiment, the memory controller 326 may perform the data copy operations within the memory device 202 using the BUFF_FILL command and the BUFF_COPY command that enables the data movements from the buffer 316 of the data bus management circuitry 202b to the memory bank 202a without exchanging the data with the host 204. In embodiment, the memory controller 326 may also issue the normal READ command or the WRITE command to the memory device 202 while the buffer 316 stores the valid data to be copied, thereby the read and write operations corresponding to the BUFF_FILL and BUFF_COPY commands may be performed without affecting the normal read and write operations.

For performing the data copy operations (as depicted in FIGS. 3a and 3b), the memory controller 326 identifies the trigger initiated by the memory copy accelerator/cache control block 324 for the data copy operations within the memory device 202. On identifying the trigger, the memory controller 326 identifies the information for performing the data operations such as, but not limited to, the data to be copied/processed within the memory device 202, the source location, the destination location, or the like. Thereafter, the memory controller 326 initiates the buffer fill (BUFF_FILL) command and the address input signals corresponding to the source location based on the identified source location information of the required data. The address input signals include the row address, the column address corresponding to the bank ID of the memory bank 202a from which the data have to be accessed (the source location). The memory controller 226 further issues the BUFF_FILL command and the address input signals to the IO circuitry 304 of the memory device 202 over the memory channel.

Figure 4A:
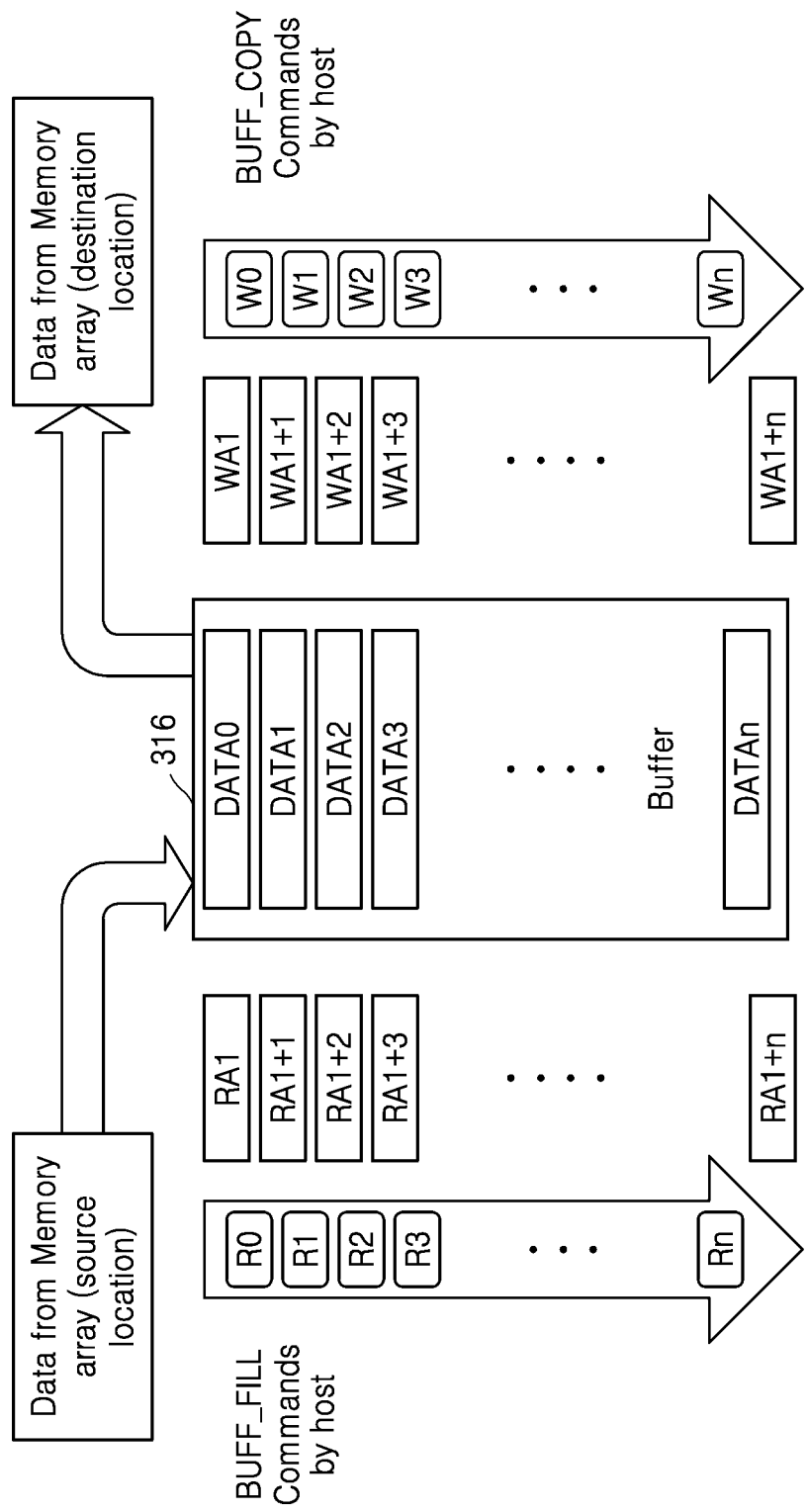
FIGS. 4a-4c are example diagrams depicting data copy and initialization operations, according to embodiments as disclosed herein.
Figure 4B:
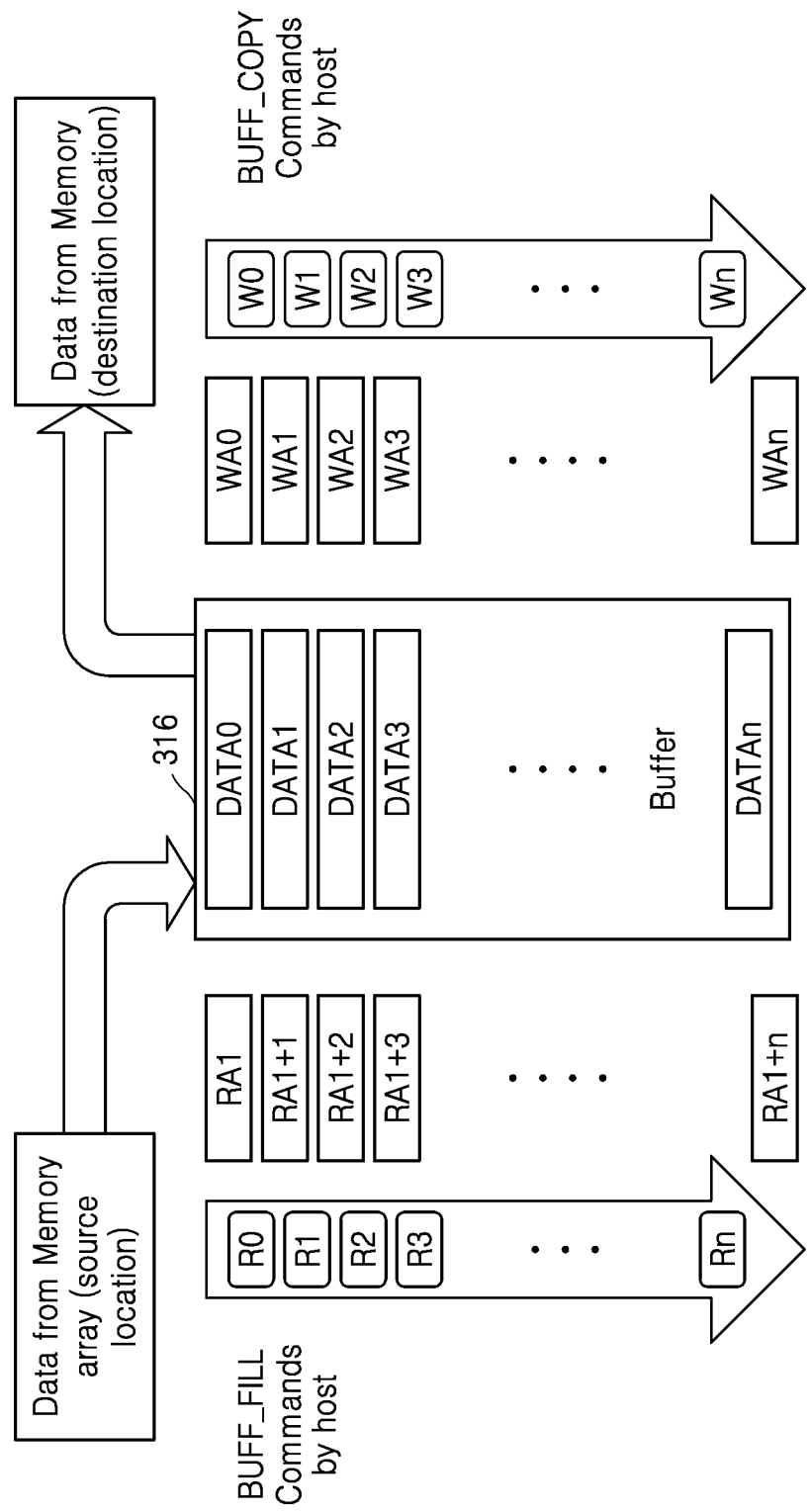
Figure 4C:
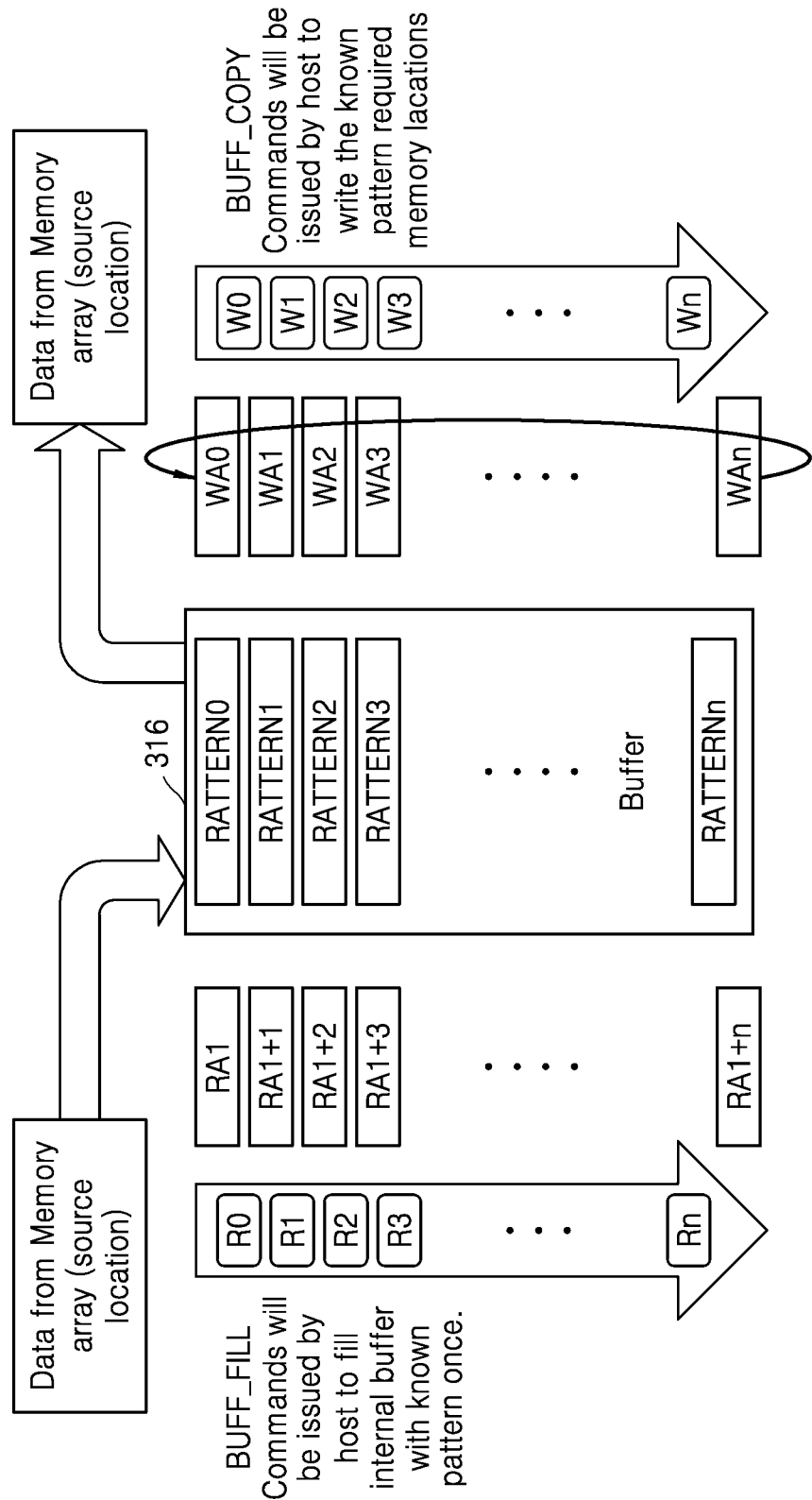

The IO circuitry 304 forwards the address input signals to the address circuitry 306 and the BUFF_FILL command to the command decoder 312. The address circuitry 306 provides the row address and the bank ID included in the address input signals to the row address circuitry 308. The row address circuitry 308 activates the row corresponding to the received row address and enables the sense amplifier for the activated row. The address circuitry 306 provides the column address included in the address input signals to the column address circuitry 310. The column address circuitry 310 forwards the received column address to the bank/column selection logic 330 associated with the received bank ID. The command decoder 312 decodes the BUFF_FILL command based on the command pattern (as depicted in FIG. 4a to FIG. 4c) received from the memory controller 326. In an example herein, the command decoder 312 decodes the BUFF_FILL command using the op-codes of the BUFF_FILL command of an instruction received from the memory controller 326-. The command decoder 312 provides the decoded BUFF_FILL command to the buffer 316, the gate 318, and the MUX 320 of the data bus management circuitry 202b. The gate 318 and the MUX 320 may be disabled on receiving the decoded BUFF_FILL command. The command decoder 312 translates the BUFF_FILL command to the READ command using the opcodes and provides the translated READ command to the bank/column selection logic 330.

On receiving the READ command from the command decoder 312 and the column address from the column address circuitry 310, the bank/column selection logic 330 accesses/reads the sense amplifier 302 and the memory bank 202a for the data associated with the column corresponding to the received column address within the activated row of the identified bank ID (i.e. the source location). The bank/column selection logic 330 further provides the accessed/read data from the source location to the pre-fetch buffer and ECC 314. The pre-fetch buffer and ECC 314 may further forward the received accessed data from the source location to the buffer 316. Alternatively, the bank/column selection logic 330 may provide the accessed/read data from the source location directly to the buffer 316 as depicted in FIG. 3b. The buffer 316 may store the accessed/read data from the source location without providing the data to the IO circuitry 304, since the gate 318 is disabled on receiving the BUFF-FILL command.

The memory controller 326 may identify the completion of accessing the data from the source location and determines the destination location to which the accessed data have to be written. The memory controller 326 then initiates the BUFF_COPY command and the address input signals corresponding to the destination location for writing the accessed data to the destination location of the memory bank 202a. The address input signals include the row address and the column address corresponding to the identified bank ID of the memory bank 202a to which the accessed data have to be written (the destination location). The memory controller 326 issues the BUFF_COPY command and the address input signals to the IO circuitry 304 over the memory channel. The IO circuitry 304 forwards the address input signals to the address circuitry 306 and the BUFF_COPY command to the command decoder 312. The address circuitry 306 provides the row address to the row address circuitry 308 and the column address to the column address circuitry 310. The row address circuitry 308 activates the row corresponding to the received row address and enables the sense amplifier for the activated row. The column address circuitry 310 forwards the received column address to the bank/column selection logic 330 associated with the received bank ID. The column address circuitry 310 feeds the received column address to the bank/column selection logic 330 associated with the received bank ID.

The command decoder 312 decodes the BUFF_COPY command using the op-codes and issues the decoded BUFF_COPY command to the buffer 316, the gate 318, and the MUX 320 of the data bus management circuitry 202b. The gate 318 and the MUX 320 may be enabled in response to the received BUFF_COPY command. On receiving the BUFF_COPY command, the buffer 316 forwards the stored accessed data of the source location to bank/column selection logic 330 through the MUX 320.

The command decoder 312 translates the BUFF_COPY command to the WRITE command using the opcodes and issues the translated WRITE command to the bank/column selection logic 330. On receiving the data, the WRITE command and the column address, the bank/column selection logic 330 connects the sense amplifier 302 associated with the memory bank 202a to the buffer 316 of the data bus management circuitry 202b to write the received data to the column corresponding to the received column address within the active row of the identified bank ID (i.e. the destination location). Thus, the data copy operations performed using the buffer 316 present in the memory device 202 eliminates the need for the data movements over the memory channel between the host 204 and the memory device 202.

Figure 3C:
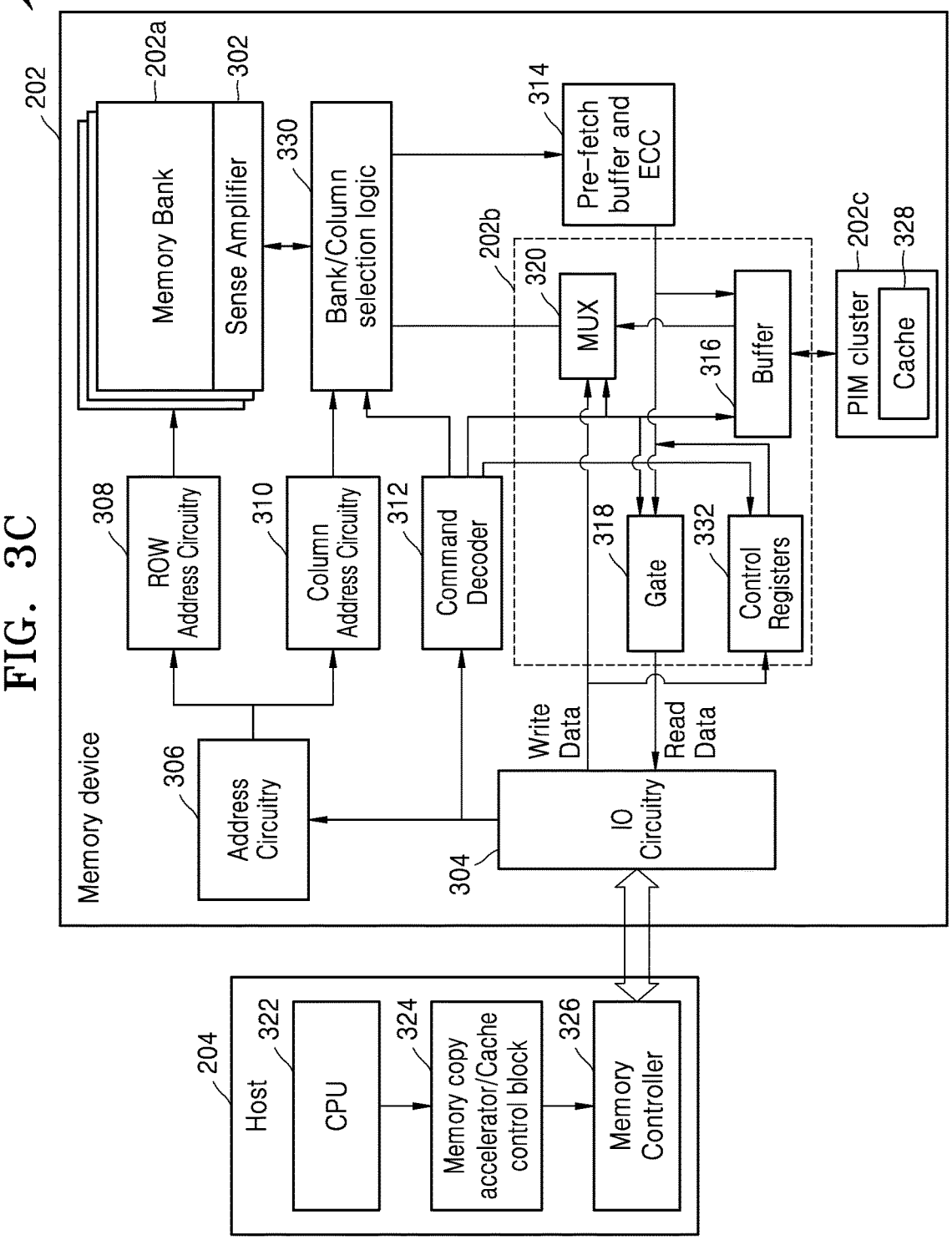
Figure 3D:
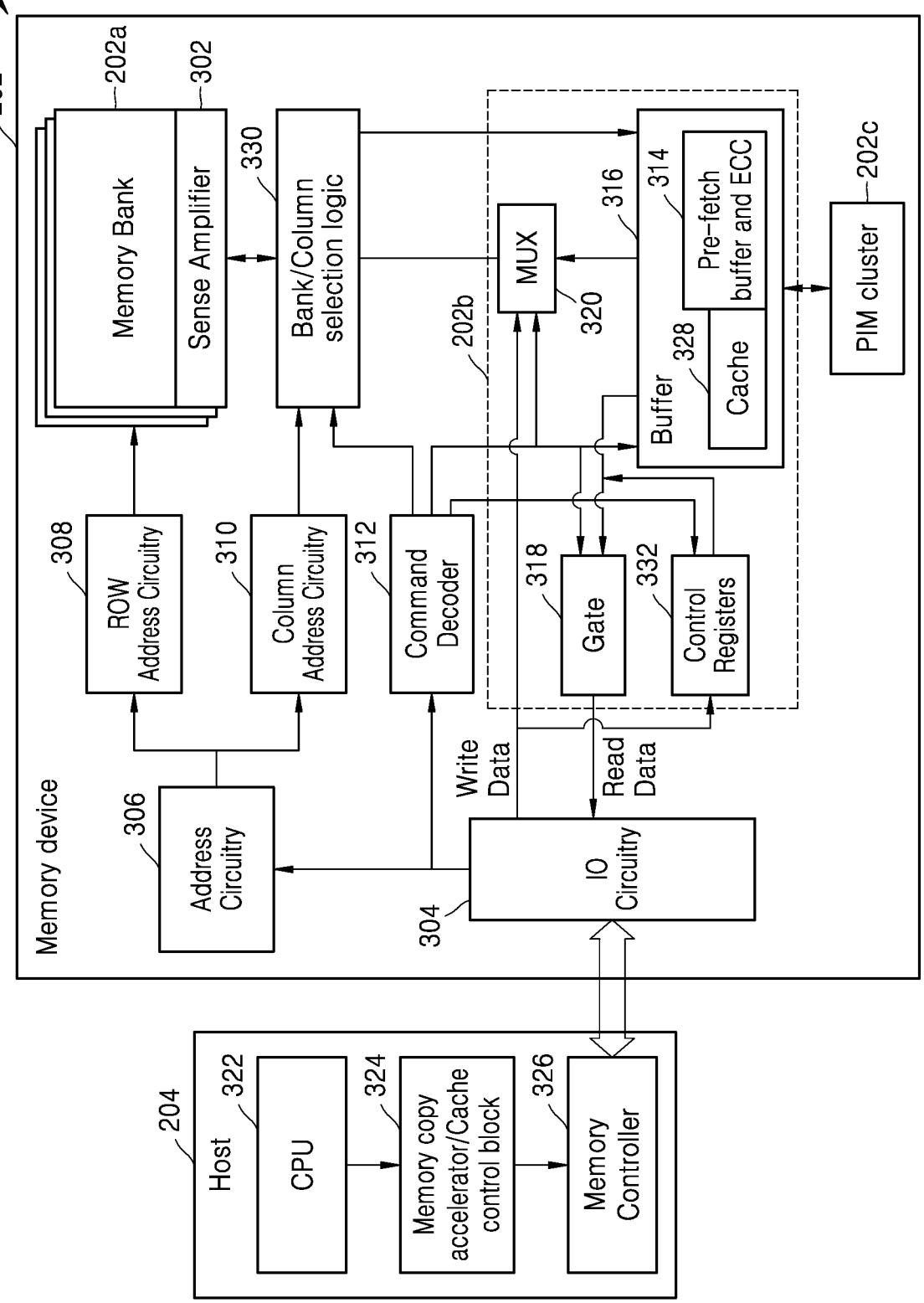

FIGS. 3c and 3d are block diagrams of the memory system 200 for performing the data processing operations within the memory device 202, according to embodiments as disclosed herein. The memory device 202 includes the IO circuitry 304, the address circuitry 306, the row address circuitry 308, the column address circuitry 310, the command decoder 312, the bank/column selection logic 330, the sense amplifier 302, the memory bank 202a, the PIM cluster 202c, control registers 332, the pre-fetch buffer and ECC 314, and the data bus management circuitry 202b. The PIM cluster 202c includes a cache 328 for storing the accessed data from the source location of the memory bank 202a, the processed data, or the like. The control registers 332 may include a set of registers, which may be exposed to the host 204 through a reserved address location that is known to the application deployed on the host 204. In an embodiment, the control registers 332 may have the reserved address to be accessed by the host 204 through the IO circuitry 304. The control registers 332 may be registered with the configured details that are provided by the host 204. Examples of the configuration details may be, but not limited to, an operation/processing operation to be performed, a size of data set, and so on. Based on the configuration details, the control registers 332 may initiate the processing operations performed by the PIM cluster 202c. The completion of the data processing operations may be identified by the host 204 based on a polling status bit in the control registers 332. It should be noted that embodiments herein are explained using an example implementation of the control registers for tracking the PIM operations, but the present invention is not limited thereto. In an embodiment, the tracking of the PIM operations may be implemented in multiple ways. The data bus management circuitry 202b includes the buffer 316, the gate 318, and the MUX 320. In an embodiment, the buffer 316 may be integrated with the pre-fetch buffer and ECC 314 and the cache 328 as depicted in FIG. 3d.

The host 204 includes the CPU 322, the memory copy accelerator/cache control block 324, and the memory controller 326. The memory controller 326 may perform the data processing operations by identifying the trigger initiated by the memory copy accelerator/cache control block 324 for the data processing operations. The memory controller 326 identifies the source location from which the data have to be accessed and the destination location to which the processed accessed data have to be written. The memory controller 326 then initiates the BUFF_FILL command and the address input signals for accessing the data from the source location. The address input signals include the row address, the column address corresponding to the bank ID of the memory bank 202a from which the data have to be accessed (the source location). The memory controller 326 issues the BUFF_FILL command to the IO circuitry 304 over the memory channel. The IO circuitry 304 forwards the BUFF_FILL command to the command decoder 312 and the address input signals to the address circuitry 306.

The command decoder 312 decodes the BUFF_FILL command and provides the decoded BUFF_FILL command to the buffer 316, the gate 318, the MUX 320, and the PIM cluster 202c. The gate 318 and the MUX 320 may be disabled on receiving the BUFF_FILL command. The command decoder 312 detects accesses to the control registers 332 by looking into reserved address space and provides the register READ/WRITE commands to the control registers 332 that may initiate the processing operations on the PIM cluster 202c after reading/accessing the data from the source location and get the status of operations. The command decoder 312 translates the BUFF_FILL command to the READ command and provides the READ command to the bank/column selection logic 330 associated with the received bank ID.

The address circuitry 306 provides the row address to the row address circuitry 308, and the column address to the column address circuitry 310. The row address circuitry 308 activates the row corresponding to the received row address and enables the sense amplifier for the activated row. The column address circuitry 310 forwards the column address to the bank/column selection logic 330 associated with the received bank ID.

On receiving the column address and the READ command, the bank/column selection logic 330 access/reads the sense amplifier 302 and the memory bank 202a for the data corresponding to the column of the column address within the activated row of the identified bank ID (the source location). The bank/column selection logic 330 further provides the accessed/read data from the source location to the pre-fetch buffer and ECC 314. The pre-fetch buffer and ECC 314 may further forward the received accessed data from the source location to the buffer 316. Alternatively, the bank/column selection logic 330 may provide the accessed/read data from the source location directly to the buffer 316 as depicted in FIG. 3d. The buffer 316 may store the accessed/read data from the source location by preventing the flow of the data to the IO circuitry 304, since the gate 318 is disabled on receiving the BUFF-FILL command. The buffer 316 further provides the accessed data to the PIM cluster 202c for processing the accessed data. The control registers 332 may trigger the processing operations/PIM operations to be performed by the PIM cluster 202c based on configurations details registered by the memory controller 326 of the host 204 with the control registers 332. Examples of the configured details may be, but not limited to, processing operation to be performed, size of data set, and so on.

The PIM cluster 202c processes the data received from the buffer 316, which corresponds to the buffer fill commands from the IO circuitry 304. The PIM cluster 202c processes the data using the computational data received from the host 204 in the defined area. The PIM cluster 202c may store the processed data in the cache 328 associated with the PIM cluster 202c. Further, the control registers 332 may obtain the status of completion of processing of the data and updates its status bit. In an embodiment, the PIM cluster 202c may update the control registers 332 upon completion of the data processing. For simplicity of drawings. a signal path for the update between the control registers 332 and the PIM cluster 202c are not explicitly drawn on the drawings.

The memory controller 326 may determine the completion of the processing operations performed by the PIM cluster 202c by polling the status bit in the control registers 332. On determining the completion of the processing operations, the memory controller 326 initiates the BUFF_COPY command and the address input signals corresponding to the destination location for the writing the processed data to the identified destination location of the memory bank 202a. The address input signals include the row address and the column address corresponding to the identified bank ID of the memory bank 202a to which the accessed data have to be written (the destination location). The memory controller 326 issues the BUFF_COPY command and the address input signals to the IO circuitry 304 over the memory channel. The IO circuitry 304 forwards the address input signals to the address circuitry 306 and the buffer copy command to the command decoder 312. The address circuitry 306 provides the row address to the row address circuitry 308 and the column address circuitry to the column address circuitry 310. The row address circuitry 308 activates the row corresponding to the received row address and enables the sense amplifier to connect to the activated row. The column address circuitry 310 feeds the received column address to the bank/column selection logic 330 associated with the received bank ID.

The command decoder 312 decodes the BUFF_COPY command using the opcodes and issues the decoded BUFF_COPY commands to the buffer 316, the gate 318, and the MUX 320 of the data bus management circuitry 202b. The gate 318 and the MUX 320 may be enabled in response to the received BUFF_COPY commands. On receiving the BUFF_COPY command, the buffer 316 receives the processed data from the PIM cluster 202c. The MUX 320 selects the received processed data from the buffer 316 and provides the processed data to the bank/column selection logic 330. The command decoder 312 translates the BUFF_COPY commands to the WRITE command using the opcodes and issues the translated WRITE command to the bank/column selection logic 330 associated with the received bank ID.

On receiving the processed data, the WRITE command and the column address, the bank/column selection logic 330 connects the sense amplifier 302 associated with the memory bank 202a to the buffer 316 of the data bus management circuitry 202b to write the received data to the column corresponding to the received column address within the activate row of the identified bank ID (i.e. the destination location). Thus, the data processing operations performed using the buffer 316 present in the memory device 202 eliminates the need for the data movements over the memory channel.

FIGS. 2a-3d show exemplary blocks of the memory system 200, but it is to be understood that other embodiments are not limited thereon. In other embodiments, the memory system 200 may include a smaller or a greater number of functional blocks. Further, the labels or names of the blocks are used only for illustrative purpose and does not limit the scope of the embodiments herein. One or more blocks may be combined together to perform the same or a substantially similar function in the memory system 200.

FIGS. 4a-4c are example diagrams depicting the data initialization operations, according to embodiments as disclosed herein. In an embodiment, the memory controller 326 of the host 204 initializes the buffer 316 and the destination locations of the memory bank 202a with read addresses and write addresses, respectively. The read addresses and write addresses correspond to the source locations and the destination locations. In an embodiment, the read addresses and the write addresses may be at least one of continuous addresses, scattered addresses, addresses associated with known data patterns to be read or written, and so on. The memory controller 326 initializes the buffer 316 with the read addresses using the BUFF_FILL commands, so that the buffer 316 may store the accessed/read data with respect to the initialized read addresses. The memory controller 326 initializes the destination locations of the memory bank 202a with the write addresses using the BUFF_COPY commands, so that buffer 316 may transfer the accessed data to the destination locations initialized with the write addresses.

In an embodiment, the memory controller 326 initializes the buffer 316 and the desired locations in the memory bank 202a with the continuous physical addresses. The physical addresses may include the read addresses corresponding to the source locations and the write addresses corresponding to the destination locations, which may be provided by the memory controller 326. The memory controller 326 issues the BUFF_FILL commands (for example: R0, R1 . . . Rn) to the buffer 316 in a sequential manner with the continuous read addresses (for example: RA1, RA1+1, RA+2 . . . RA1+n) to initialize the locations of the buffer 316. The memory controller 326 further enables the buffer 316 to store the data accessed (for example: DATA0, DATA1, . . . DATAn) from the source location of the memory bank 202a corresponding to the BUFF_FILL commands in the locations initialized with the continuous read addresses in the sequential manner.

The memory controller 326 issues the BUFF_COPY commands (for example: W0, W1, W2, . . . Wn) to the desired destination locations in the memory bank 202a in the sequential manner with the continuous write addresses (for example: WA1, WA1+1 . . . WA1+n). The memory controller 326 further enables the buffer 316 to transfer the stored accessed data to the desired destination locations of the memory bank 202a that are initialized with the continuous write addresses in the sequential manner. In an embodiment, the write addresses may be issued based on an order of the read addresses. Since, the order of the read addresses and the write addresses assigned/mapped is same, the accessed data, which is first fetched in/stored in the buffer 316 may be fetched out/transferred first to the desired destination location of the memory bank 202a. In an embodiment, the buffer 316 may be a first-in-first-out (FIFO) buffer. The present invention is not limited thereto. In an embodiment, the buffer 316 may be a last-in-first-out (LIFO) buffer.

For example, the accessed data DATA0 and the DATA1 from the source location of the memory bank 202a corresponding to the BUFF_FILL commands R0 and R1 may be stored in the buffer 316 in the locations initialized with respect to the initialized continuous read addresses RA1 and RA1+1 respectively. Further, on receiving the buffer copy commands W0 and W1, the accessed data DATA0 and the DATA1 from the buffer 316 may be transferred to the destination locations of the memory bank 202a initialized with the continuous write addresses WA1, and WA1+1 respectively, wherein the order of the write addresses have to be same as the order of the read addresses. Thus, the first fetched in (stored) accessed data DATA0 may be first fetched out from the buffer 316 to write into the destination location of the memory bank 202a.

In an embodiment, the memory controller 326 initializes the buffer 316 and the desired destination locations in the memory bank 202a with the scattered physical addresses. The physical addresses may include the read addresses corresponding to the source location and the write addresses corresponding to the destination locations, which may be provided by the memory controller 326. The memory controller 326 issues the BUFF_FILL commands (for example: R0, R1 ... Rn) to the buffer 316 in a sequential manner with the scattered read addresses (for example: RA0, RA1, ... Ran) to initialize the locations of the buffer 316. The memory controller 326 then enables the buffer 316 to store the data accessed (for example: DATA0, DATA1, ... DATAn) from the source location of the memory bank 202a corresponding to the BUFF_FILL commands in the locations initialized with the scattered read addresses in the sequential manner.

The memory controller 326 issues the BUFF_COPY commands (for example: W0, W1, W2, ... Wn) to the desired destination locations in the memory bank 202a in the sequential manner with the scattered write addresses (for example: W0, W1, W2, ... Wn). The memory controller 326 further enables the buffer 316 to transfer the stored accessed data to the desired destination locations of the memory bank 202a that are initialized with the scattered addresses in the sequential manner. In an embodiment, the write addresses may be issued without depending on the order of the read addresses. However, the data in the memory bank 202a have to be stored in the order of the read/accessed data.

Consider an example scenario, wherein the memory controller 326 enables the buffer 316 to store the data accessed from the source locations of the memory bank 202a DATA 0, DATA1, and DATA2 in the locations initialized with the scattered read addresses/sequential read addresses RA0, RA1, and RA2. The memory controller 326 may further enable the buffer 316 to transfer the DATA 1, and DATA 2 to the desired destination locations of the memory bank 202a before the DATA0. However, the data have to be stored in the desired destination locations of the memory bank 202a based on the order of accessed/read data that is the DATA 1 has to be stored in the desired destination location of the memory bank 202a assigned with WA1, and the DATA 2 has to be stored in the desired destination location of the memory bank 202a assigned with WA2. Also, the memory controller 326 may skip the DATA 0. The memory controller 326 may provide a dummy BUFF_COPY command to discard the DATA 0 or to end of buffer, where data shifting or data rotation occurs. The memory controller 326 may further enable the buffer 316 to transfer the DATA 0 to the desired destination location of the memory bank 202a initialized with the scattered write address WA0 even after transferring the DATA 1 and the DATA 2. The order of write data should be maintained that is DATA0~DATA n (until the end of the buffer). Otherwise, the data may roll around, and the data may point to DATA 0 for a next BUFF_COPY operation.

In an embodiment, the memory controller 326 may initialize the buffer 316/desired destination locations of the memory bank 202a with the known patterns. As depicted in FIG. 4c, the memory controller 326 writes the known patterns (for example: a PATTERN 0, a PATTERN 1, ... a PATTERN N) to the memory bank 202a using the normal WRITE commands. In an embodiment, the known patterns may be data such as, "1", "0", or the like. Thereafter, the memory controller 326 issues the BUFF_FILL commands to the buffer 316 (for example: RA0, RA1, ... RAn) to initialize the locations of the buffer 316 with the known patterns stored in the memory bank 202a. The memory controller 326 then enables the buffer 316 to store the data accessed (for example: DATA0, DATA1, ... DATAn) from the source location of the memory bank 202a corresponding to the BUFF_FILL commands in the locations initialized with the known patterns in the sequential manner. Further, the data stored in the buffer 316 may rotate or shift and points to the DATA 0 after the DATA n.

The memory controller 326 issues the BUFF_COPY commands (for example: W0, W1, W2, ... Wn) to the desired destination locations in the memory bank 202a in the sequential manner with the known patterns. Therefore, the buffer 316 may transfer the stored accessed data to the desired destination locations of the memory bank 202a that are initialized with the known patterns in the sequential manner. In an embodiment, the memory controller 326 may issue the BUFF_COPY commands to the memory bank 202a for initializing the multiple locations with the known patterns.

FIG. 5 is a table depicting an example command pattern of the BUFF_FILL command, the BUFF_COPY command, the normal READ command, and the normal WRITE command, according to embodiments as disclosed herein. Embodiments herein enable the memory controller 326 to initiate the BUFF_FILL command and the BUFF_COPY command by performing encoding based on the source location and the destination location determined for the read and write operations. An example command pattern of the BUFF_FILL and BUFF_COPY commands are depicted in FIG. 5. The present invention is not limited thereto. In an embodiment, the BUFF_FILL and BUFF_COPY commands may include other type of command patterns.

The command pattern of the BUFF_FILL command, the BUFF_COPY command, the normal READ command, and the normal WRITE command may include field/op-codes corresponding to functions such as, but not limited to, a clock enable (CKE), a chip select (CS_n), an activation command input (ACT_n), command inputs (RAS_n, CAS_n, and WE_n), and an address input A11. The op-codes of the BUFF_FILL command, the BUFF_COPY command, the normal READ command, and the normal WRITE command may be same for the CKE, the CS_N, and the WE_n. The CKE may be registered as CKE HIGH ('H') and CKE LOW ('L'). The CKE HIGH ('H') activates, and CKE Low ('L') deactivates, internal clock signals and device input buffers and output drivers. The CKE has to be registered as HIGH throughout the read and write operations. The CS_n may be provided for an external memory bank/rank selections and all commands may be masked when the CS_n is registered HIGH. The ACT_n defines an activation command being entered along with the CS_n. When the ACT_n registers as High, the command inputs (RAS_n, CAS_n, and WE_n) act as commands for read, write or other type of operations.

The op-codes of the BUFF_FILL and BUFF_COPY commands and the normal READ and WRITE commands for the command inputs (the RAS_n, and the CAS_n) may vary. In an example herein, the command decoder 312 may differentiate the BUFF_FILL and BUFF_COPY commands and the normal READ and WRITE commands based on the op-codes of the command inputs (the RAS_n, and the CAS_n). In case of the normal READ and WRITE commands, the op-codes for the RAS_n, the CAS_n may be 'H', and respectively. In case of the BUFF_FILL command and the BUFF_COPY command, the op-code for the RAS_n, the CAS_n may be 'L', and 'H' respectively. In case of the normal READ command, the BUFF_FILL, and the BUFF_COPY commands, the op-code for the WE_n may be 'H'. In case of the normal WRITE command, the op-code for the WE_n may be 'L'.

The op-codes of the BUFF_FILL command, the BUFF_COPY command, the normal READ command, and the normal WRITE command may also be different for the A11. The op-code of the BUFF_FILL command may be HIGH ('H') for the A11. The op-code of the BUFF_FILL command may be Low (L') for the A11. The op-codes of the normal READ command and the normal WRITE command may be VALID (V') for the A11.

In an example herein, the command decoder 312 of the memory device 202 may identify each of the BUFF_FILL and BUFF_COPY commands, based on the op-code of the A11.

Figure 6:
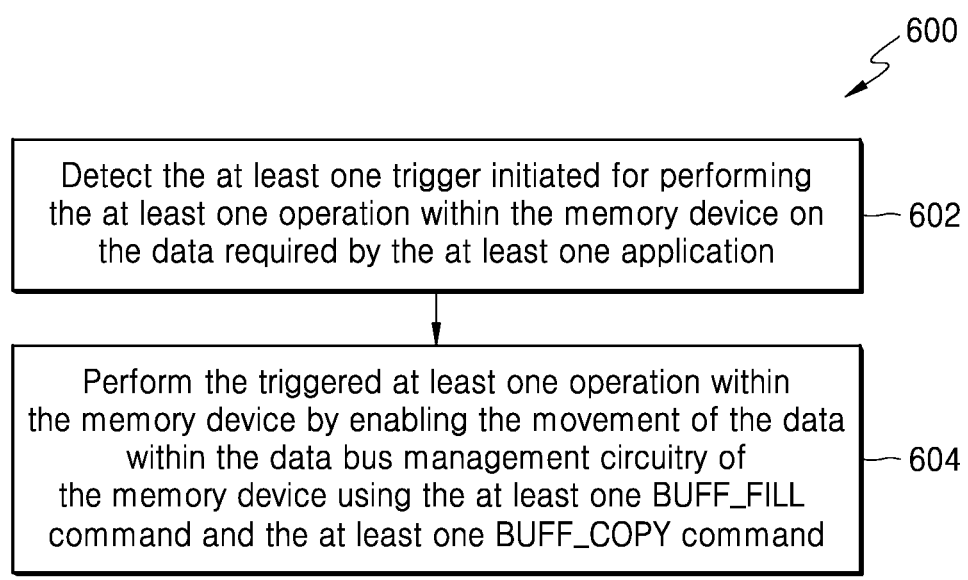
FIG. 6 is a flow diagram depicting a method for performing the data operations within the memory device, according to embodiments as disclosed herein.

FIG. 6 is a flow diagram 600 depicting a method for performing the data operations within the memory device 202, according to embodiments as disclosed herein. At step 602, the method includes detecting, by the host 204, the at least one trigger initiated for performing the at least one operation within the memory device 202 on the data required by the at least one application. The operation includes at least one of the data copy operation, the data processing operation, and the data initialization operations.

At step 604, the method includes performing, by the host 204, the triggered at least one operation within the memory device 202 by enabling the movement of the data between the data bus management circuitry 202b of the memory device 202 and at least one bank thereof, without exchanging the data with the host 204, using the at least one BUFF_FILL command and the at least one BUFF_COPY command. The various actions, acts, blocks, steps, or the like in the method and the flow diagram 600 may be performed in the order presented, in a different order or simultaneously. Further, in some embodiments, some of the actions, acts, blocks, steps, or the like may be omitted, added, modified, skipped, or the like without departing from the scope of the invention.

Figure 7:
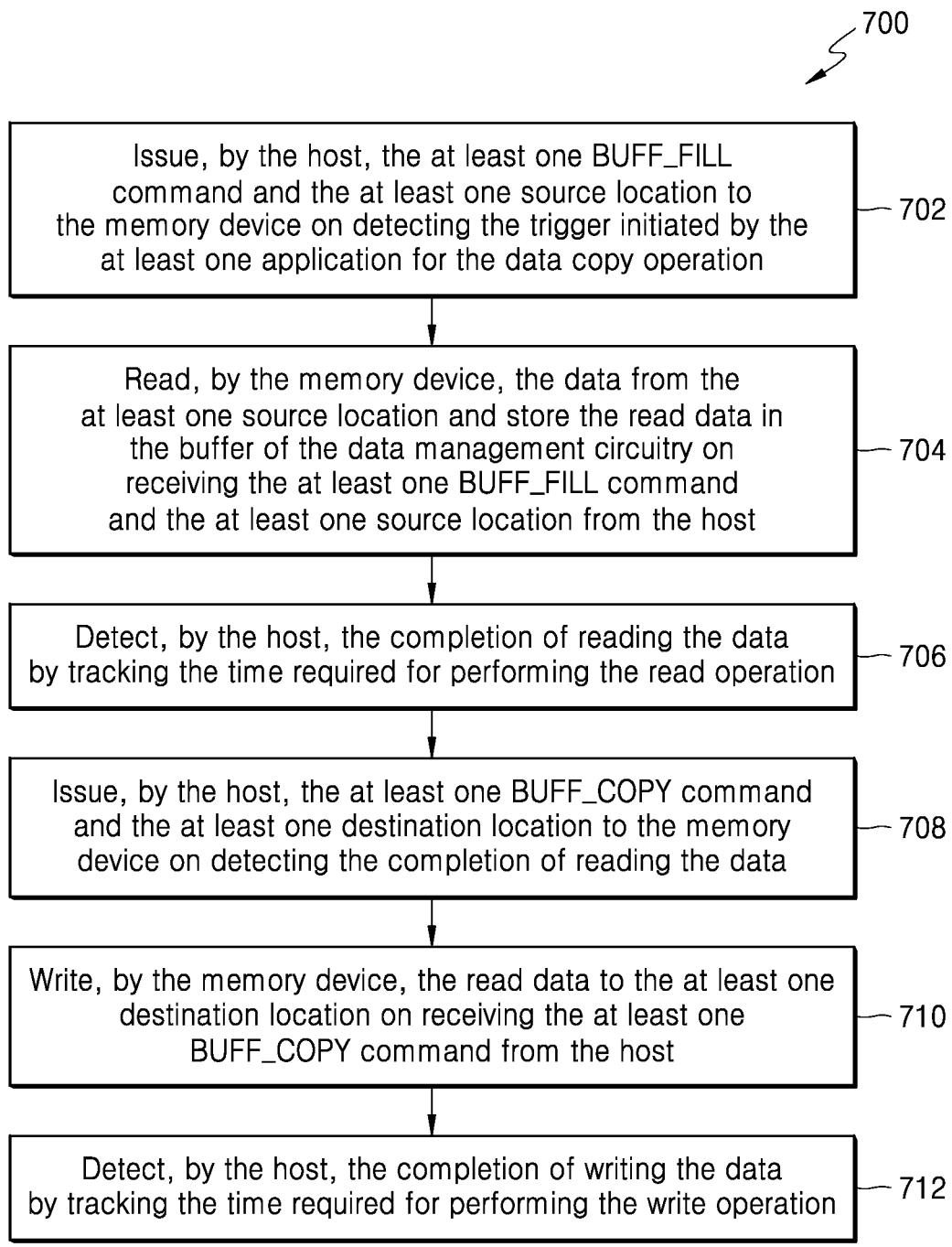
FIG. 7 is a flow diagram depicting a method for performing the data copy operations within the memory device, according to embodiments as disclosed herein.

FIG. 7 is a flow diagram 700 depicting a method for performing the data copy operations within the memory device 202, according to embodiments as disclosed herein.

At step 702, the method includes issuing, by the host 204, the at least one BUFF_FILL command and the at least one source location to the memory device 202 on detecting the trigger initiated by the at least one application for the data copy operation. In an embodiment, the host 204 may detect the trigger based on the source location and the destination location associated with the at least one application. The source location and the destination location may include the source addresses and the destination addresses within the same bank or different banks of the same memory device 202, respectively. For example, when the memory device 202 is provided in plural, the trigger may be initiated when the data copy operation are to be performed in one of the memory device 202 in plural.

At step 704, the method includes reading, by the memory device 202, the data from the at least one source location and storing the read data in the buffer 316 of the data bus management circuitry 202b on receiving the at least one BUFF_FILL command and the at least one source location from the host 204. The buffer 316 may store the data by preventing the flow of the read to the host 204 using the gate 318 that is disabled on receiving the BUFF_FILL command.

At step 706, the method includes detecting, by the host 204, the completion of reading the data by tracking the time required for performing the read operation. At step 708, the method includes issuing, by the host 204, the at least one BUFF_COPY command and the at least one destination location to the memory device 202 on detecting the completion of reading the data.

At step 710, the method includes writing, by the memory device 202, the read data to the at least one destination location on receiving the at least one BUFF_COPY command from the host 204. The memory device 202 transfers the read data stored in the buffer 316 to the at least one destination location using the MUX 320. At step 712, the method includes detecting, by the host 204, the completion of writing the data by tracking the time required for performing the write operation. The various actions, acts, blocks, steps, or the like in the method and the flow diagram 700 may be performed in the order presented, in a different order or simultaneously. Further, in some embodiments, some of the actions, acts, blocks, steps, or the like may be omitted, added, modified, skipped, or the like without departing from the scope of the invention.

Figure 8:
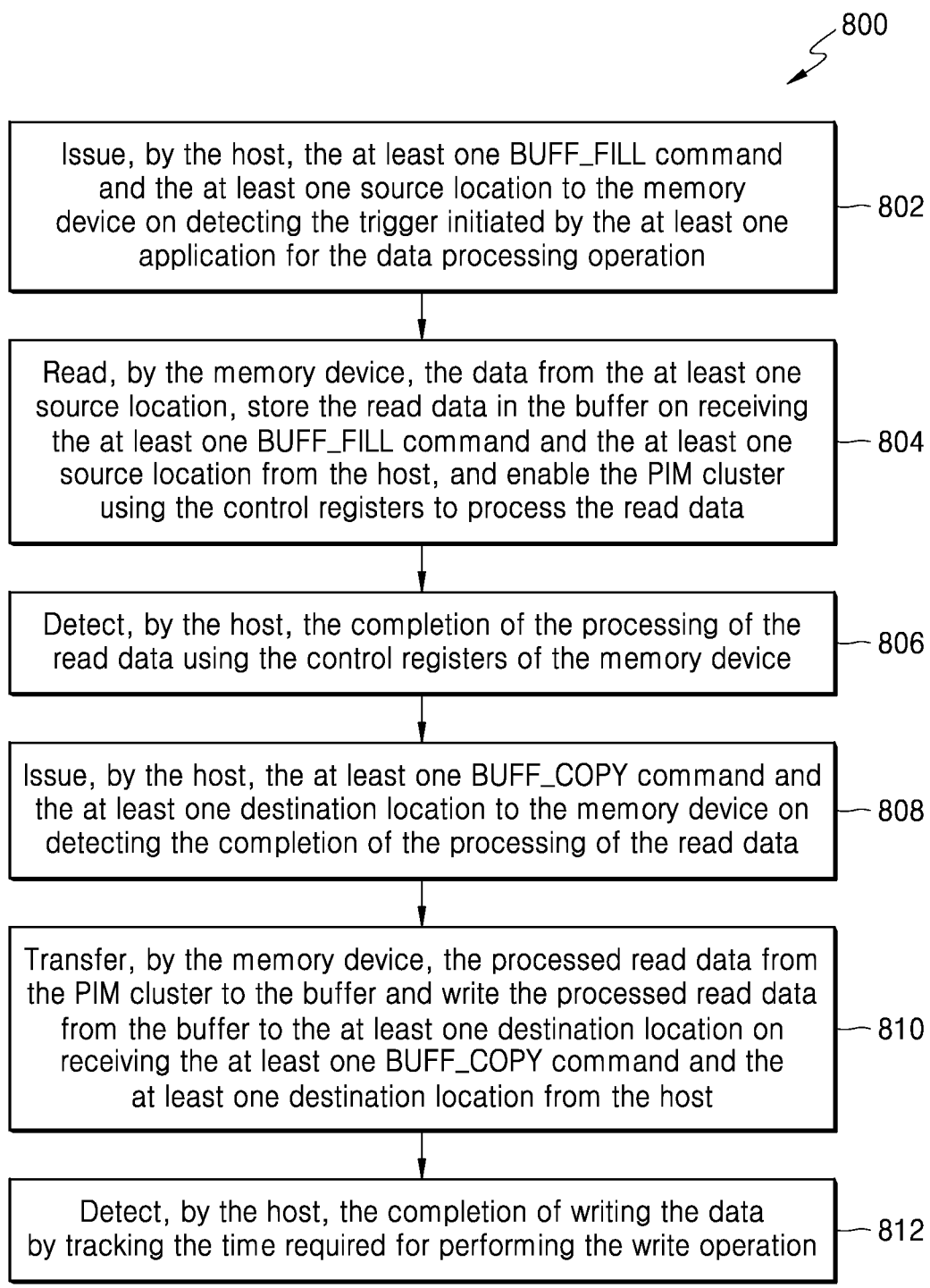
FIG. 8 is a flow diagram depicting a method for performing the data processing operations within the memory device, according to embodiments as disclosed herein.

FIG. 8 is a flow diagram 800 depicting a method for performing the data processing operations within the memory device 202, according to embodiments as disclosed herein.

At step 802, the method includes issuing, by the host 204, the at least one BUFF_FILL command and the at least one source location to the memory device 202 on detecting the trigger initiated by the at least one application for the data processing operation. In an embodiment, the host 204 may detect the trigger based on the source location and the destination location associated with the at least one application. The source location and the destination location may include the source addresses and the destination addresses within the same bank of the same memory device 202 or different banks of the same memory device 202, respectively. For example, when the memory device 202 is provided in plural, the trigger may be initiated when the data processing operation are to be performed in one of the memory device 202 in plural.

At step 804, the method includes reading, by the memory device 202, the data from the at least one source location, storing the read data in the buffer 316 and enabling the PIM cluster 202c using the control registers 332 to receive the read data from the buffer 316 and process the read data on receiving the at least one BUFF_FILL command and the at least one source location from the host 204.

At step 806, the method includes detecting, by the host 204, the completion of the processing of the read data using the control registers 332 of the memory device 202. At step 808, the method includes issuing, by the host 204, the at least one BUFF_COPY command and the at least one destination location to the memory device 202 on detecting the completion of the processing of the read data.

At step 810, the method includes transferring, by the memory device 202, the processed read data from the PIM cluster 202c to the buffer 316 and transferring the processed read data from the buffer 316 to the at least one destination location on receiving the at least one BUFF_COPY command and the at least one destination location from the host 204. At step 812, the method includes detecting, by the host 204, the completion of writing the data by tracking the time required for performing the write operation. The various actions, acts, blocks, steps, or the like in the method and the flow diagram 800 may be performed in the order presented, in a different order or simultaneously. Further, in some embodiments, some of the actions, acts, blocks, steps, or the like may be omitted, added, modified, skipped, or the like without departing from the scope of the invention.

Figure 9:
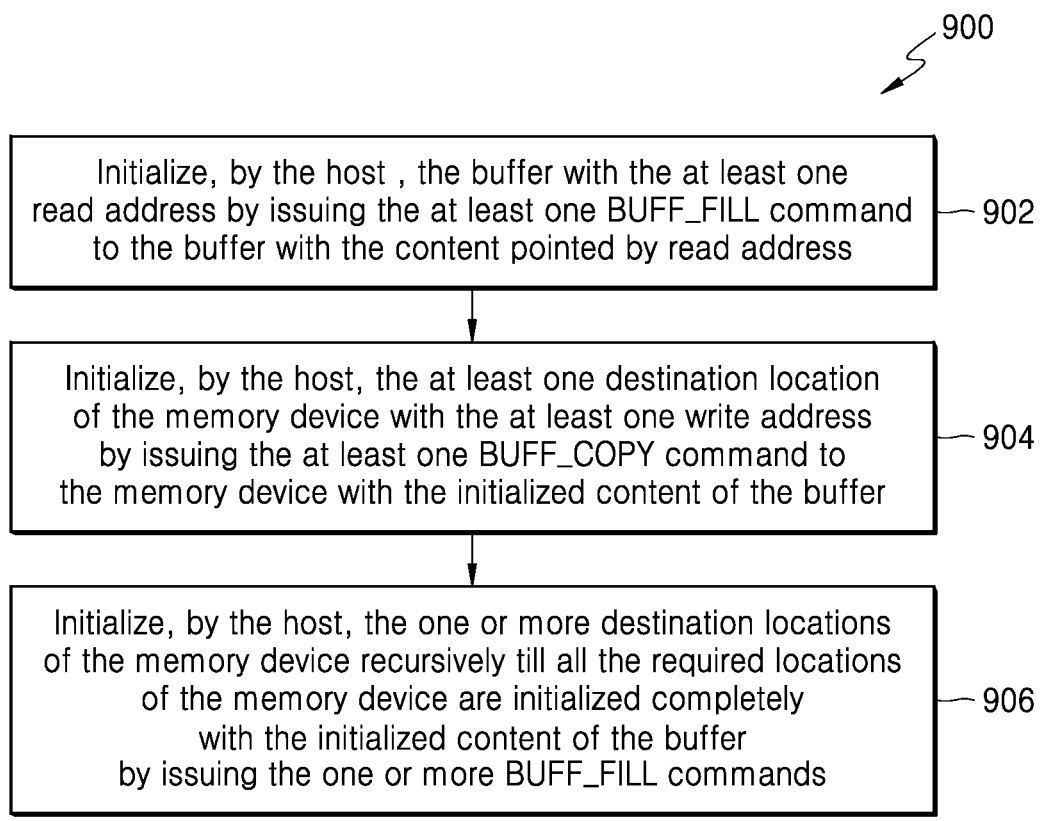
FIG. 9 is a flow diagram depicting a method for performing the data initialization operations, according to embodiments as disclosed herein.

FIG. 9 is a flow diagram 900 depicting a method for performing the data initialization operations, according to embodiments as disclosed herein.

At step 902, the method includes initializing, by the host 204, the buffer 316 with the at least one read address by issuing the at least one BUFF_FILL command to the buffer 316 with the read data/content pointed by the read address. Therefore, the read data/content pointed by the read address is stored in the buffer (316) with respect to the initialized at least one read address. The read address corresponds to the source location.

At step 904, the method includes initializing, by the host 204, the at least one destination location of the memory device 202 with the at least one write address by issuing the at least one BUFF_COPY command to the memory device 202 with the initialized content/read data of the buffer 316. Therefore, the stored read data from the buffer 316 is transferred to the at least one destination location of the memory device 202 initialized with the at least one write address. The at least one read address and the at least one write address include at least one of continuous read and write addresses respectively, the scattered read and write addresses respectively, and the known data patterns. At step 906, the method includes initializing, by the host 204, the one or more destination locations of the memory device recursively till all the required locations of the memory device are initialized completely with the initialized content of the buffer by issuing the one or more BUFF_FILL commands. The various actions, acts, blocks, steps, or the like in the method and the flow diagram 900 may be performed in the order presented, in a different order or simultaneously. Further, in some embodiments, some of the actions, acts, blocks, steps, or the like may be omitted, added, modified, skipped, or the like without departing from the scope of the invention.

Figure 10A:
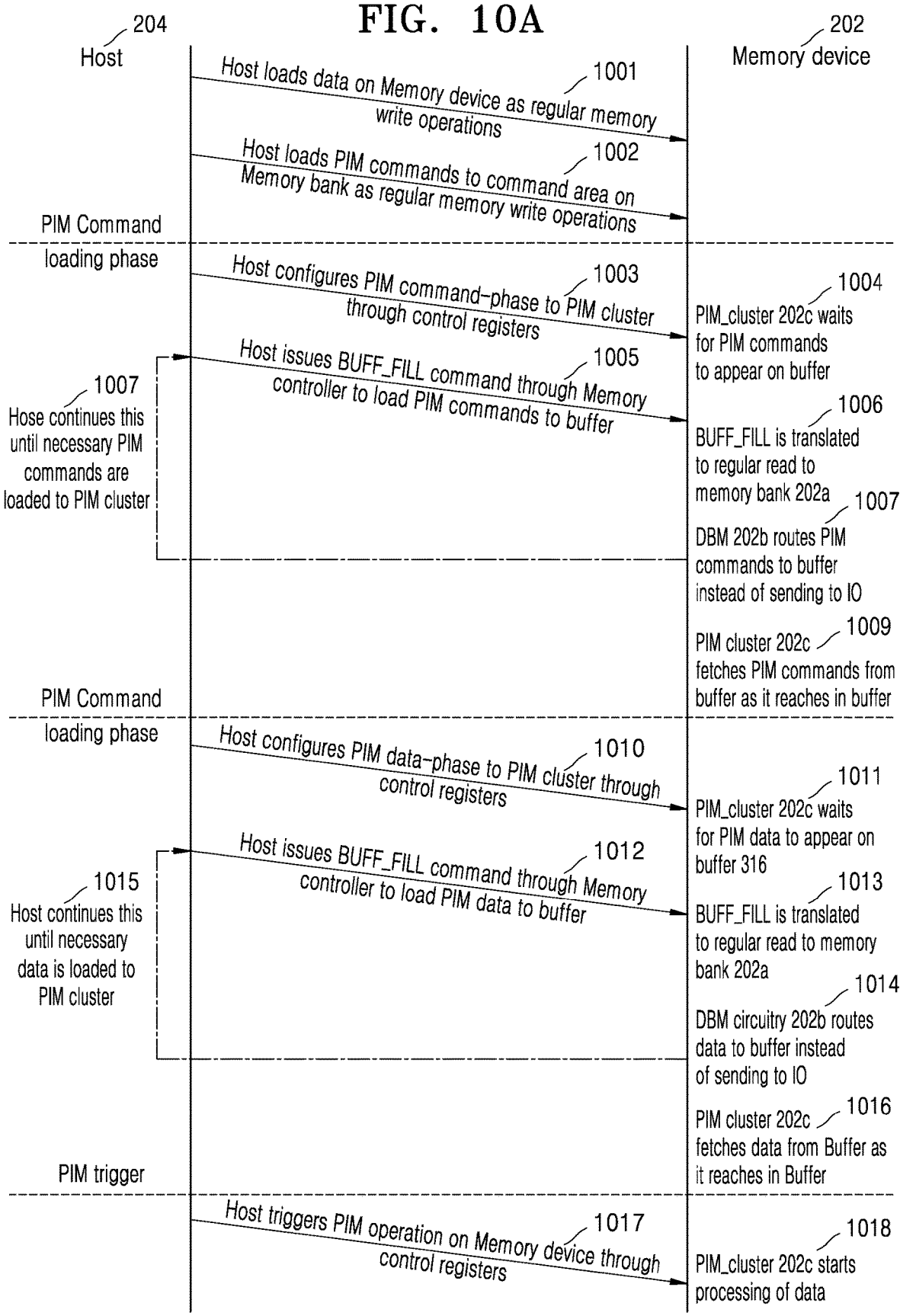
FIGS. 10a and 10b are example sequence diagrams depicting initialization of a processing in memory (PIM)
Figure 10B:
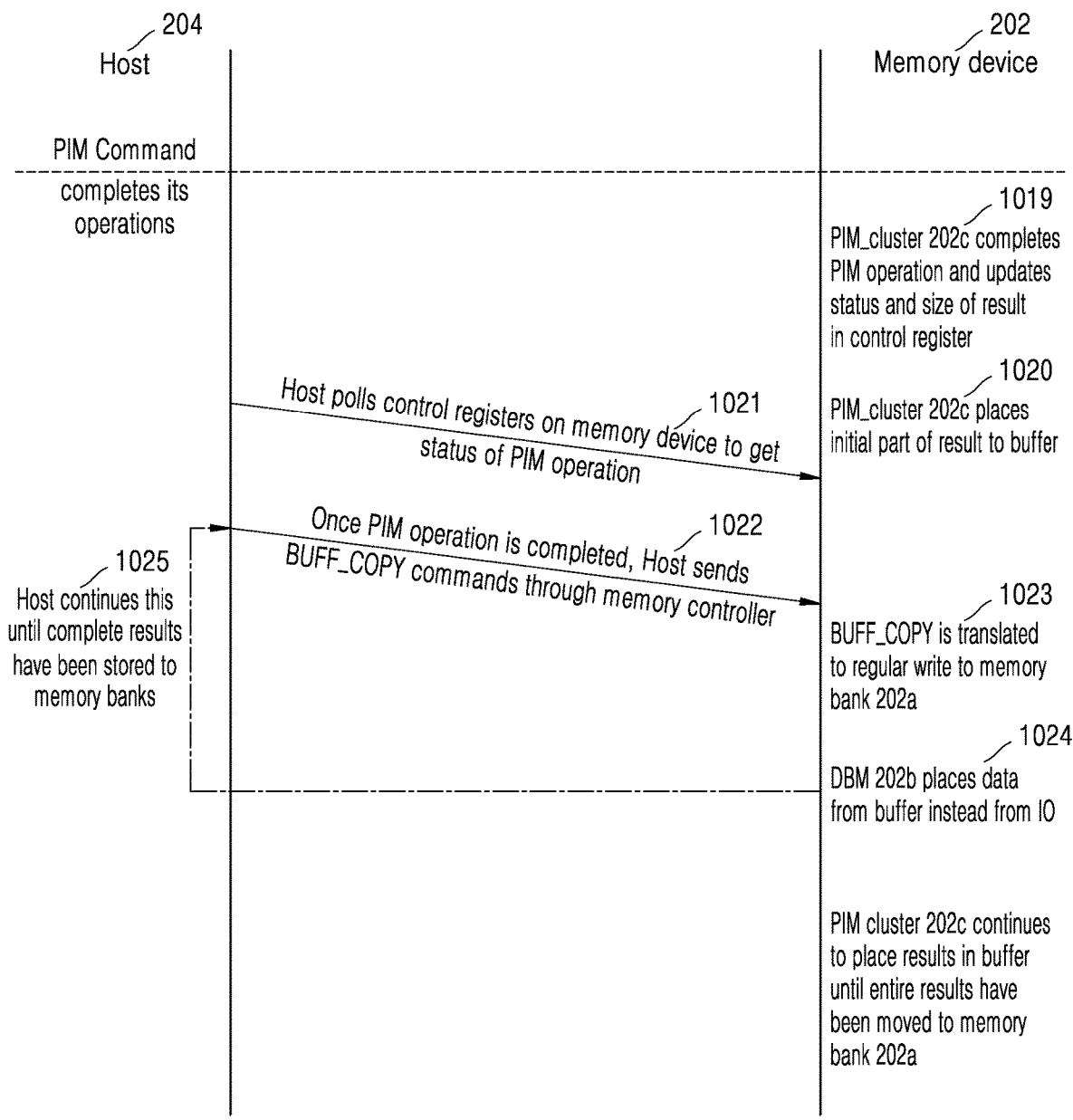

FIGS. 10a and 10b are example sequence diagrams depicting initialization of the PIM cluster 202c with the computation data and processing of the data on the PIM cluster 202c using the initialized computation data, according to embodiments as disclosed herein.

At step 1001, the host 204 loads/initializes the data on the memory bank 202a of the memory device 202 by performing the read and write operations using the normal READ and WRITE commands. At step 1002, the host 204 loads PIM commands on a specified command area in the memory bank 202a of the memory device 202 by performing the write operations using the normal WRITE command. The PIM commands can be functional commands of the PIM cluster 202c. The PIM commands may vary based on functionalities of the PIM cluster 202c. The specified command area may be an area defined in the memory bank 202a of the memory device 202 for storing the PIM commands. An address of the area may be defined in the control register and varied based on the specification of the PIM cluster 202c.

On initializing the PIM commands on the specified command area in the memory bank 202a, the host 204 initiates a PIM command initialization/loading phase. During the PIM command initialization phase, at step 1003, the host 204 configures the PIM cluster 202c with a PIM command phase through the control registers. At step 1004, the PIM cluster 202c configured with the PIM command phase waits for the PIM commands to arrive on the buffer 316.

At step 1005, the host 204 issues the BUFF_FILL command to the command decoder 312 through the memory controller 326 to load the PIM commands to the buffer 316 from the specified command area in the memory bank 202a. At step 1006, the command decoder 312 also translates the BUFF_FILL command to the normal READ command and provides the normal READ command to the memory bank 202a.

At step 1007, the data bus management (DBM) circuitry 202b receives the PIM commands from the specified command area in the memory bank 202a and routes the PIM commands received from the memory bank 202 to the buffer 316. At step 1008, the host 204 repeats the steps 1005, 1006, and 1007 until the all required PIM commands for a PIM operation/processing operation have been routed into the buffer 316. At step 1009, as the PIM commands have been routed to the buffer 316, the PIM cluster 202c fetches the PIM commands from the buffer 316 and stores the PIM commands in the internal cache 328.

On initializing the PIM cluster 202c with the PIM commands, the host 204 initiates a PIM data loading phase. During the PIM data loading phase, the host 204 may initialize the PIM cluster 202c with the computation data and enable the PIM cluster 202c to receive the data from the buffer 316 for the processing. At step 1010, the host 204 configures the PIM cluster 202c with a PIM data phase through the control registers. In the PIM data phase, the PIM cluster 202c may be loaded with the data fetched from the memory bank of the memory bank 202a for processing. At step 1011, the PIM cluster 202c configured with the PIM data phase waits for the data to arrive on the buffer 316.

At step 1012, the host 204 issues the BUFF_FILL command to the command decoder 312 through the memory controller 326 to load the data to the buffer 316. At step 1013, the command decoder 312 provides the received BUFF_FILL command to the data bus management circuitry 202b. The command decoder 312 also translates the BUFF_FILL command to the normal READ command and provides the normal READ command to the memory bank 202a.

At step 1014, the data bus management circuitry 202b receives the data from the memory bank 202a and routes the data to the buffer 316. At step 1015, the host 204 repeats the steps 1012, 1013, and 1014, until the required data have been routed into the buffer 316. At step 1016, the PIM cluster 202c moves the data from the buffer 316 to the internal cache 328, as the buffer 316 receives the data from the memory bank 202a.

On initializing the PIM cluster 202c with the data, at step 1017, the host 204 triggers the processing operation on the PIM cluster 202c through the control registers. At step 1018, the PIM cluster 202c initiates processing of the received data.

On processing the received data, at step 1019, the PIM cluster 202c completes the processing of data and updates status of the processing and size of a result of the processing in the control registers. At step 1020, the PIM cluster 202c provides an initial part of the result in the buffer 316.

At step 1021, the host 204 polls the control registers to obtain the status of the processing. Once the processing is completed, at step 1022, the host 204 sends the BUFF_COPY commands to the command decoder 312 through the memory controller 326. At step 1023, the command decoder 312 translates the BUFF_COPY command to the normal WRITE command and provides the normal WRITE command to the memory bank 202a. At step 1024, the data bus management circuitry 202b provides the data from the buffer 316 (that is the processed data) to the memory bank 202a.

At step 1025, the host 204 repeats the steps 1022, 1023, and 1024 and the PIM cluster 202c continues to provide the results of the processing in the buffer 316, until the entire results of the processing have been moved to the memory bank 202a.

Figure 11:
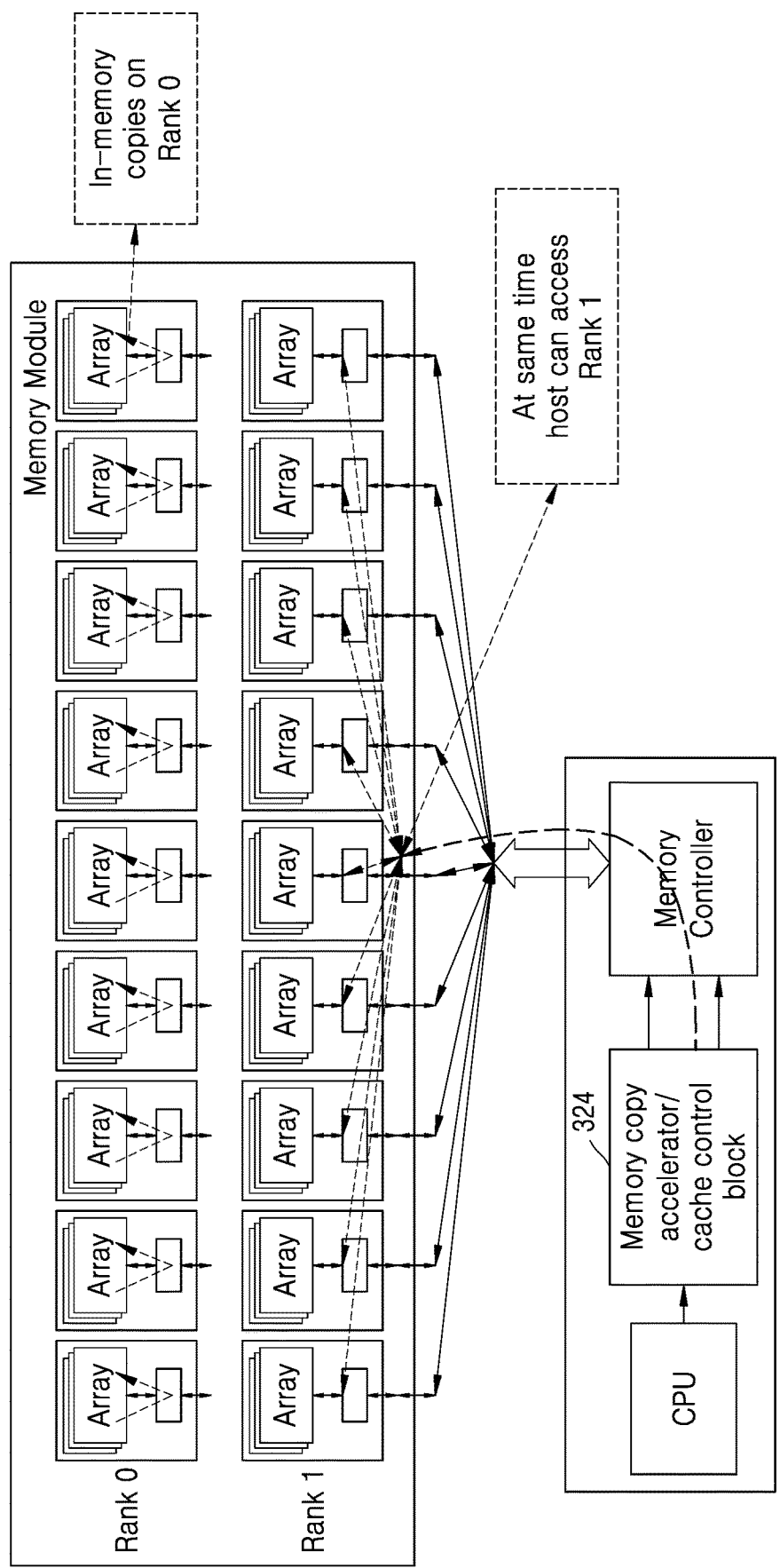
FIG. 11 is an example diagram depicting the data copy operations performed at the memory module level with multi rank capability, according to embodiments as disclosed herein.

FIG. 11 is an example diagram depicting the data copy operations performed at a memory module level, according to embodiments as disclosed herein. In a memory module, multiple memory devices 202 are arranged in multiple rank configurations. Each rank includes a plurality of memory devices 202, each memory device having multiple memory banks 202a. In such a case, the host 204 may perform the data copy operations within the memory module 104 by considering the memory devices of at least one of the rank (for example, rank 0) as the buffer(s) 316 for the data movements. During the data copy operations, the host 204 may also access the memory banks of the other ranks (for example, rank 1) by managing data traffic according to the on-going data copy operations, thereby enhancing the throughput and performance of the memory system 200.

Embodiments herein enable in-memory data operations without involving data movements over a memory channel, wherein the data operations include data copy operations, data processing operations, and data initialization operations.

Embodiments herein implement a buffer within a memory device for performing the data copy operations, and a processing in time memory (PIM) cluster within the memory device for performing the data processing operations.

Embodiments herein enable data copy between any locations within a memory device, internal data movements between a memory bank of the memory device and a processing in time memory (PIM) (for example: a PIM on a buffer die of a HBM), in-memory data transfer between a processing area and the memory bank within the memory device, and memory initialization by preloading a buffer with predefined pattern.

Embodiments herein further use buffer fill (BUFF_FILL) commands and buffer copy (BUFF_COPY) commands for performing the data operations, which results in improving power for all in-memory data copies, as there may not any toggling on DQ lines on the memory device and increasing flexibility to copy the data even at byte level granularity.

Embodiments herein provide flexibility to copy even a byte of information by utilizing a data mask driven from the host 204-even during the BUFF_COPY operation. Thus, only required bytes may be copied to the destination locations of the memory device as directed by the host.

The embodiments disclosed herein may be implemented through at least one software program running on at least one hardware device and performing network management functions to control the elements. The elements shown in FIGS. 2a-8, may be at least one of a hardware device, or a combination of hardware device and software module.

The embodiments disclosed herein describe methods and systems for performing data operations within a memory device. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL) another programming language, or implemented by one or more VHDL or several software modules being executed on at least one hardware device. The hardware device may be any kind of portable device that may be programmed. The device may also include means which could be e.g. hardware means like e.g. an ASIC, or a combination of hardware and software means, e.g. an ASIC and an FPGA, or at least one microprocessor and at least one memory with software modules located therein. The method embodiments described herein could be implemented partly in hardware and partly in software. Alternatively, the invention may be implemented on different hardware devices, e.g. using a plurality of CPUs.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein may be practiced with modification within the spirit and scope of the embodiments as described herein.

What is claimed is:

1. A memory system comprising:
   a memory device including a plurality of memory banks and a data bus management circuit; and
   a host coupled to the memory device,
   wherein the host comprises a memory controller configured to:
      detect a trigger initiated by at least one application for performing a data copy operation on data stored within the memory device;
      issue at least one buffer fill (BUFF_FILL) command and at least one buffer copy (BUFF_COPY) command; and
      perform the data copy operation on the data within the memory device by enabling movement of the data between the data bus management circuit of the memory device and at least one memory bank of the plurality of memory banks, without exchanging the data with the host, using the at least one BUFF_FILL command and the at least one BUFF_COPY command, and wherein the memory device further comprises a command decoder configured to:
  receive the at least one BUFF_FILL command from the memory controller;
  decode the at least one BUFF_FILL command and issue at least one decoded BUFF_FILL command to the data bus management circuit and
  translate the at least one BUFF_FILL command to at least one READ command and issue the at least one translated READ command to a bank/column selection logic of the memory device.

2. The memory system of claim 1,
wherein the data copy operation includes reading the data from at least one source location of the memory device and writing the read data to at least one destination location of the memory device.

3. The memory system of claim 2,
wherein the at least one source location includes at least one read address,
wherein the at least one destination location includes at least one write address, and
wherein the at least one read address and the at least one write address are within the same memory bank of the plurality of memory banks.

4. The memory system of claim 2,
wherein the at least one source location and the at least one destination location include at least one read address and at least one write address, respectively, in different memory banks of the plurality of memory banks.

5. The memory system of claim 2,
wherein the memory controller is further configured to:
  issue the at least one BUFF_FILL command and the at least one source location to the memory device for reading the data from the at least one source location;
  detect completion of the reading of the data from the at least one source location; and
  issue the at least one BUFF_COPY command and the at least one destination location to the memory device for writing the read data to the at least one destination location.

6. The memory system of claim 5,
wherein the bank/column selection logic of the memory device is configured to:
  connect, in response to the at least one translated READ command, a sense amplifier of the memory device associated with the at least one source location to the data bus management circuit, and
wherein the data bus management circuit comprises:
  a gate;
  a multiplexer (MUX), wherein the gate and the MUX, in response to the at least one decoded BUFF_FILL command, are disabled, and wherein the disabled gate is configured to prevent a flow of the read data to the memory controller of the host; and
  a buffer configured to store, in response to the at least one decoded BUFF_FILL command, the read data.

7. The memory system of claim 6,
wherein the command decoder is further configured to:
  receive the at least one BUFF_COPY command from the memory controller;
  decode the at least one received BUFF_COPY command and issue the at least one decoded BUFF_COPY command to the buffer, the gate, and the MUX of the data bus management circuit; and
  translate the at least one received BUFF_COPY command to at least one WRITE command and issue the at least one translated WRITE command to the bank/column selection logic of the memory device,
wherein the buffer of the data bus management circuit is further configured to:
  transfer, in response to the at least one decoded BUFF_COPY command, the stored read data from the buffer to the bank/column selection logic through the MUX, and
wherein the bank/column selection logic of the memory device is configured to:
  connect, in response to the at least one translated WRITE command, the buffer to a sense amplifier associated with the at least one destination location so that the read data stored in the buffer is written to the at least one destination location.

8. A memory device comprising:
a plurality of memory banks;
a data bus management circuit and
a command decoder configured to:
  receive at least one BUFF_FILL command from a host
  decode the at least one received BUFF_FILL command and issue at least one decoded BUFF_FILL command to the data bus management circuit; and
  translate the at least one received BUFF_FILL command to at least one READ command and issue the at least one translated READ command to a bank/column selection logic of the memory device,
wherein a data bus management circuit configured to:
  receive, in response to at least one buffer fill (BUFF_FILL) command from the host, data required by at least one application which is running on the host from at least one source location of a first memory bank of the plurality of memory banks and store the received data in a buffer of the data bus management circuit; and
  write, in response to at least one buffer copy (BUFF_COPY) command from the host, the stored data in the buffer to at least one destination location of a second memory bank of the plurality of memory banks.

9. The memory device of claim 8,
wherein the at least one source location of the first memory bank includes at least one read address in the first memory bank and the destination location of the second memory bank includes at least one write address in the second memory bank, and
wherein the first memory bank and the second memory bank are the same memory bank of the plurality of memory banks.

10. The memory device of claim 8,
wherein the at least one source location of the first memory bank and the at least one destination location of the second memory bank include at least one read address and at least one write address, respectively, and
wherein the first memory bank and the second memory bank are different memory banks of the plurality of memory banks.

11. The memory device of claim 8,
wherein the data bus management circuit comprises:
  a gate;
  a multiplexer (MUX), wherein the gate and the MUX are, in response to the at least one BUFF_FILL command, disabled, and wherein the disabled gate is configured to prevent a flow of the received data to a memory controller of the host; and
  a buffer configured to store, in response to the at least one BUFF_FILL command, the received data.

12. The memory device of claim 8,
wherein the data bus management circuit of the memory device is further configured to:
receive, in response to the at least one BUFF_FILL command, the data required by at least one application from the at least one source location of the first memory bank, store the received data in the buffer, and perform a computational operation on the stored data to generate processed data; and
write, in response to the at least one BUFF_COPY command, the processed read data to the at least one destination location of the second memory bank.

13. The memory device of claim 12,
wherein the memory device further comprises a processing in memory (PIM) cluster configured to:
receive, in response to the at least one BUFF_COPY command, the stored data from the buffer and perform the computational operation on the received stored data to generate the processed data; and
transfer, in response to the at least one BUFF_COPY command, the processed data to the buffer for writing the processed data to the at least one destination location of the second memory bank.

14. The memory device of claim 8,
wherein the buffer of the data bus management circuit is initialized with the at least one read address using the at least one BUFF_FILL command for storing the received data from the at least one source location, and
wherein the at least one read address includes at least one of continuous read addresses, scattered read addresses, and read addresses associated with a known pattern of data to be read.

15. The memory device of claim 13,
wherein the second memory bank is initialized with the at least one write address using the at least one BUFF_COPY command,
wherein the buffer transfers the stored read data to the initialized at least one write address, and
wherein the at least one write address includes at least one of continuous write addresses, scattered write addresses, and write addresses associated with a known pattern of data to be written.

16. A memory system comprising:
a memory device including a plurality of memory banks, a processing in memory (PIM) circuit, and a data bus management circuit; and
a host coupled to the memory device and including a memory controller,
wherein the memory is controller configured to:
detect a trigger initiated by at least one application for performing a data processing operation on data stored within the memory device;
issue at least one buffer fill (BUFF_FILL) command and at least one buffer copy (BUFF_COPY) command; and
perform the data processing operation on the data within the memory device by enabling movement of the data between the data bus management circuit of the memory device and at least one memory bank of the plurality of memory banks, without exchanging the data with the host, using the at least one BUFF_FILL command and the at least one BUFF_COPY command, and
wherein the memory device further comprises a command decoder configured to:
receive the at least one BUFF_FILL command from the memory controller;
decode the at least one received BUFF_FILL command and issue the at least one decoded BUFF_FILL command to the buffer, the data bus management circuit, and the PIM circuit; and
translate the at least one received BUFF_FILL command to at least one READ command and issue the at least one translated READ command to a bank/column selection logic of the memory device.

17. The memory system of claim 16,
wherein the data processing operation includes reading the data from at least one source location of the memory device, performing a computational operation on the read data to generate processed data, and writing the processed data to at least one destination location of the memory device.

18. The memory system of claim 17,
wherein the memory controller is further configured to:
issue the at least one BUFF_FILL command and the at least one source location to the memory device for reading the data from the at least one source location and performing, by the processing in memory (PIM) circuit of the memory device, the computational operation on the read data;
detect completion of the performing of the computational operation on the read data using control registers of the memory device; and
issue the at least one BUFF_COPY command and the at least one destination location to the memory device for writing the processed data to the at least one destination location.

19. The memory system of claim 18,
wherein the bank/column selection logic of the memory device is configured to connect, in response to the at least one translated READ command, a sense amplifier associated with the at least one source location to the data bus management circuit,
wherein the data bus management circuit comprises:
a gate;
a multiplexer (MUX), wherein the gate and the MUX are disabled on receiving the at least one decoded BUFF_FILL command from the command decoder, and wherein the disabled gate is configured to prevent a flow of the read data to the memory controller of the host; and
a buffer configured to store the read data from the at least one source location, and
wherein the PIM circuit is configured to receive the stored read data from the buffer and perform the computational operation on the received read data to generate the processed data.

20. The memory system of claim 19,
wherein the command decoder is further configured to:
receive the at least one BUFF_COPY command from the memory controller;
decode the at least one received BUFF_COPY command and issue the at least one decoded BUFF_COPY command to the buffer, the gate, and the MUX of the data bus management circuit and the PIM circuit; and
translate the at least one received BUFF_COPY command to at least one WRITE command and issue the at least one translated WRITE command to the bank/column selection logic of the memory device, wherein the buffer of the data bus management circuit is further configured to:
  receive, in response to at least one decoded BUFF_COPY command, the processed data from the PIM circuit; and
  transfer the received processed data to the bank/column selection logic through the MUX, and
wherein the bank/column selection logic of the memory device is configured to:
  connect, in response to the at least one translated WRITE command, the buffer to the sense amplifier associated with the at least one destination location so that the processed data stored in the buffer is written to the at least one destination location.

* * * * *